(12) United States Patent
Yamazaki et al.

(10) Patent No.: US 8,437,165 B2
(45) Date of Patent: May 7, 2013

(54) SEMICONDUCTOR MEMORY DEVICE AND SEMICONDUCTOR DEVICE

(75) Inventors: Shunpei Yamazaki, Tokyo (JP); Jun Koyama, Kanagawa (JP); Kiyoshi Kato, Kanagawa (JP); Yasuhiko Takemura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 257 days.

(21) Appl. No.: 13/034,750

(22) Filed: Feb. 25, 2011

(65) Prior Publication Data

US 2011/0216571 A1  Sep. 8, 2011

(30) Foreign Application Priority Data

Mar. 4, 2010  (JP) .................................. 2010-047902

(51) Int. Cl.
*G11C 5/06* (2006.01)
(52) U.S. Cl.
USPC .......................................................... 365/72
(58) Field of Classification Search ...................... 365/72
See application file for complete search history.

(56) References Cited

U.S. PATENT DOCUMENTS

| | | | |
|---|---|---|---|
| 4,466,081 A | 8/1984 | Masuoka | |
| 5,349,366 A | 9/1994 | Yamazaki et al. | |
| 5,731,856 A | 3/1998 | Kim et al. | |
| 5,744,864 A | 4/1998 | Cillessen et al. | |
| 5,940,705 A | 8/1999 | Lee et al. | |
| 6,127,702 A | 10/2000 | Yamazaki et al. | |
| 6,294,274 B1 | 9/2001 | Kawazoe et al. | |
| 6,563,174 B2 | 5/2003 | Kawasaki et al. | |
| 6,576,943 B1 | 6/2003 | Ishii et al. | |
| 6,727,522 B1 | 4/2004 | Kawasaki et al. | |
| 6,876,023 B2 | 4/2005 | Ishii et al. | |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — Hoai V Ho
*Assistant Examiner* — Pablo Huerta
(74) *Attorney, Agent, or Firm* — Fish & Richardson P.C.

(57) ABSTRACT

A matrix is formed using a plurality of memory cells in each of which a drain of the writing transistor is connected to a gate of a reading transistor and one electrode of a capacitor. A gate of the writing transistor, a source of the writing transistor, a source of the reading transistor, and a drain of the reading transistor are connected to a writing word line, a writing bit line, a reading bit line, and a bias line, respectively. In order to reduce the number of wirings, a writing word line to which the gate of the writing transistor is not connected is substituted for the reading word line. Further, the writing bit line is substituted for the reading bit line.

21 Claims, 18 Drawing Sheets

U.S. PATENT DOCUMENTS

| | | |
|---|---|---|
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,189,992 B2 | 3/2007 | Wager, III et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,339,187 B2 | 3/2008 | Wager, III et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,888,207 B2 | 2/2011 | Wager, III et al. |
| 2001/0046027 A1 | 11/2001 | Tai et al. |
| 2002/0056838 A1 | 5/2002 | Ogawa |
| 2002/0096702 A1 | 7/2002 | Ishii et al. |
| 2002/0132454 A1 | 9/2002 | Ohtsu et al. |
| 2003/0189401 A1 | 10/2003 | Kido et al. |
| 2003/0218221 A1 | 11/2003 | Wager, III et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2005/0205921 A1 | 9/2005 | Ishii et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0108198 A1 | 5/2008 | Wager, III et al. |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0002590 A1 | 1/2009 | Kimura |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0097838 A1 | 4/2010 | Tanaka et al. |
| 2010/0109002 A1 | 5/2010 | Itagaki et al. |
| 2010/0148171 A1 | 6/2010 | Hayashi et al. |
| 2010/0193785 A1 | 8/2010 | Kimura |
| 2011/0157961 A1* | 6/2011 | Yamazaki et al. ............ 365/149 |
| 2011/0182110 A1 | 7/2011 | Yamazaki et al. |
| 2011/0205774 A1 | 8/2011 | Takemura |
| 2012/0033484 A1* | 2/2012 | Matsuzaki et al. ............ 365/149 |
| 2012/0187397 A1* | 7/2012 | Yamazaki et al. ............. 257/43 |

FOREIGN PATENT DOCUMENTS

| | | |
|---|---|---|
| JP | 47-027647 A | 10/1972 |
| JP | 56-162875 A | 12/1981 |
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-119298 A | 5/1993 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2000-269457 A | 9/2000 |
| JP | 2001-053164 A | 2/2001 |
| JP | 2001-351386 A | 12/2001 |
| JP | 2002-076356 A | 3/2002 |
| JP | 2002-093171 A | 3/2002 |
| JP | 2002-094029 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-502597 A | 1/2006 |
| JP | 2006-165532 A | 6/2006 |
| JP | 2008-262962 A | 10/2008 |
| JP | 2009-033145 A | 2/2009 |
| JP | 2009-182194 A | 8/2009 |
| KR | 2002-0021310 A | 3/2002 |
| WO | 00/55920 A1 | 9/2000 |
| WO | 2004/038757 A2 | 5/2004 |
| WO | 2004/114391 A1 | 12/2004 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: AL and SN-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies In ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] At Temperatures Over 1000°C," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3. and Ga2O3(ZnO)m (m=7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3-Ga2ZnO4-ZnO system at 1350°C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In-Ga-Zn-Oxide TFTS With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTS and Their Application for Large Size AMOLED." AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In-Ga-Zn-Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Ishii, T et al., "A Poly-Silicon TFT With a Sub-5-nm Thick Channel for Low-Power Gain Cell Memory in Mobile Applications," IEEE Transactions on Electron Devices, Nov. 1, 2004, vol. 51, No. 11, pp. 1805-1810.

Kim, W et al., "An Experimental High-Density DRAM Cell with a Built-in Gain Stage," IEEE Journal of Solid-State Circuits, Aug. 1, 1994, vol. 29, No. 8, pp. 978-981.

Shukuri, S et al., "A Complementary Gain Cell Technology for Sub-1 V Supply DRAMs," IEDM 92: Technical Digest of International Electron Devices Meeting, Dec. 13, 1992, pp. 1006-1008.

Shukuri, S et al., "A Semi-Static Complementary Gain Cell Technology for Sub-1 V Supply DRAM's," IEEE Transactions on Electron Devices, Jun. 1, 1994, vol. 41, No. 6, pp. 926-931.

International Search Report, PCT Application No. PCT/JP2011/054425, dated May 31, 2011, 3 pages.

Written Opinion, PCT Application No. PCT/JP2011/054425, dated May 31, 2011, 5 pages.

* cited by examiner

SEMICONDUCTOR MEMORY DEVICE AND SEMICONDUCTOR DEVICE

TECHNICAL FIELD

The present invention relates to a memory device using a semiconductor.

BACKGROUND ART

There are many kinds of memory devices using semiconductors. For example, a dynamic random access memory (DRAM), a static random access memory (SRAM), an electrically erasable and programmable read only memory (EEPROM), a flash memory, and the like can be given.

In a DRAM, data is stored by holding charge in a capacitor which is provided in a memory cell. However, even when a transistor used for switching is in an off state, a slight amount of leakage current is generated between a source and a drain; thus, the data is lost within a relatively short time (several tens of seconds at the longest). Therefore, the data needs to be rewritten (refreshed) in a certain cycle (generally several tens of milliseconds).

In an SRAM, data is held by utilizing a bistable state of a flip-flop circuit. Although a CMOS inverter is generally used in a flip-flop circuit of an SRAM, since six transistors are used in one memory cell, an integration degree of the SRAM is lower than an integration degree of a DRAM. In addition, the data is lost when power is not supplied.

On the other hand, in an EEPROM or a flash memory, a so-called floating gate is provided between a channel and a gate and charge is stored in the floating gate, whereby data is held. The charge stored in the floating gate is held even after power supply to a transistor stops, which is why these memories are called non-volatile memories. For example, Patent Document 1 may be referred to for a flash memory.

In this specification, these memories are hereinafter called floating gate non-volatile memories (FGNVM), in particular. Since data at some stages (multivalued data) can be stored in one memory cell in an FGNVM, storage capacity can be large. Further, since the number of contact holes can be significantly decreased in a NAND-type flash memory, an integration degree can be increased to some extent.

However, in a conventional FGNVM, high voltage is needed at the time of injection of charge to a floating gate or removal of the charge. Because of this, deterioration of a gate insulating film cannot be avoided and writing and erasing cannot be repeated without limitation. Further, by application of high voltage, interference between adjacent memory cells occurs when a certain integration degree is achieved; therefore, a certain distance needs to be kept between the memory cells.

REFERENCE

Patent Document

[Patent Document 1] Japanese Published Patent Application No. S57-105889
[Patent Document 2] Japanese Published Patent Application No. 2001-53164

DISCLOSURE OF INVENTION

As described above, a conventional semiconductor memory device has good points and bad points and there has been no semiconductor devices meeting all necessary conditions. In a memory device, the first priority is lower power consumption. This is because when the power consumption is high, there is a problem in that the size of a device for supplying power needs to be larger, or that an operating time with a battery is shortened. Another reason is because, in some cases, a semiconductor element generates heat and thus the characteristics of the element are deteriorated, and a circuit is damaged. In addition, there is preferably no limitation on the number of writing times and it is desirable that writing can be performed one billion times or more.

In light of this point, a DRAM is not preferred because in a DRAM, leakage current is generated all the time, a refreshing operation needs performed, and thus much power is consumed. In contrast, in an SRAM, although a problem of power consumption can be solved to some extent, the integration degree cannot be increased because six transistors are included in one memory cell. Moreover, in an FGNVM, although the power consumption and the integration degree are not problematic, the number of writing times is a hundred thousand or less.

In view of the above, it is a first object of an embodiment of the present invention to achieve the following three conditions: power consumed by a memory cell for holding memory is lower than that in a DRAM; the number of transistors used in a memory cell is five or less; and the number of writing times is one million or more. Further, it is a second object to achieve the following two conditions: data is held without power supply for 10 hours or longer, preferably 100 hours or longer; and the number of writing times is one million or more. According to an embodiment of the present invention, the above-described first or second object is achieved. Note that in this specification, a data holding time is a time needed for the amount of charge held in a memory cell to be decreased to 90% of the initial amount.

In an embodiment of the present invention, in addition to the above objects, it is another object to provide a novel semiconductor device, specifically a novel semiconductor memory device. It is another object to provide a driving method of a novel semiconductor device, specifically a novel semiconductor memory device. Further, it is another object to provide a manufacturing method of a novel semiconductor device, specifically a novel semiconductor memory device.

The present invention will be described below; terms used in this specification are briefly described. In this specification, when one of a source and a drain of a transistor is called a source, the other is called a drain for convenience, and they are not particularly distinguished for reasons such as the following: a source and a drain have the same or substantially the same structure and function; and even when the structures are different, potential applied to a source and a drain is not constant and polarity of the potential is not always the same. Therefore, a source in this specification can be alternatively referred to as a drain.

Further, in this specification, when "A is orthogonal to B (in a matrix)", A and B may intersect at right angles; alternatively, A and B may intersect physically at different angles, which can be expressed in the simplest circuit diagram as intersection at right angles. When "A is parallel to B (in a matrix)", the two wirings may be provided so as to physically intersect, which can be expressed in the simplest circuit diagram as parallel.

In a first embodiment of the present invention, one memory cell includes a transistor as a writing transistor, in which leakage current between a source and a drain is low, the other transistor (a reading transistor), and a capacitor. Further, as wirings connected to these, five kinds of wirings that are a writing word line, a writing bit line, a reading word line, a reading bit line, and a bias line are prepared.

The drain of the writing transistor is connected to a gate of the reading transistor and one electrode of the capacitor. Further, a gate of the writing transistor is connected to the writing word line; a source of the writing transistor is connected to the writing bit line; a source of the reading transistor is connected to the reading bit line; a drain of the reading transistor is connected to the bias line; and the other electrode of the capacitor is connected to the reading word line.

In the writing transistor in an off state (in the case of an n-channel transistor, a state where the potential of the gate is lower than the potential of the source and the drain), leakage current between the source and the drain is preferably $1 \times 10^{-20}$ A or lower, preferably $1 \times 10^{-21}$ A or lower at a temperature when the transistor is in use (e.g., 25° C.), or $1 \times 10^{-20}$ A or lower at 85° C. In the case of a general silicon semiconductor, it is difficult to realize leakage current having such a small value; however, such a value can be achieved with a transistor in which an oxide semiconductor whose band gap is larger than that of a silicon semiconductor and is preferably 2.5 eV or more, is processed in a preferable condition and is used in a channel. Therefore, an oxide semiconductor is preferably used for the writing transistor. Needless to say, if leakage current can be made to have a value smaller than or equal to the above-described value with the use of other kinds of semiconductors, the use of such semiconductors is not precluded.

Although a variety of known materials can be used as the oxide semiconductor, a material with a band gap of 3 electron volts or more, preferably greater than or equal to 3 electron volts and less than 3.6 electron volts is desirable. In addition, it is desirable to use a material whose electron affinity is 4 electron volts or more, further preferably greater than or equal to 4 electron volts and less than 4.9 electron volts. Among such materials, one whose carrier concentration is less than $1 \times 10^{14}$ cm$^{-3}$, preferably less than $1 \times 10^{11}$ cm$^{-3}$ is desirable. The present inventors found that semiconductor characteristics which are exhibited by an oxide semiconductor meeting such conditions hardly differ from those observed at room temperature even at 150° C., for example.

As for the reading transistor, although there is no limitation on leakage current between the source and the drain in an off state, it is desirable to use a transistor which operates at high speed in order to increase the reading rate. It is preferable to use a transistor with switching speed of 10 nanoseconds or less. Further, in both the writing transistor and the reading transistor, gate leakage current (leakage current between the gate and the source or between the gate and the drain) needs to be extremely low; also in the capacitor, internal leakage current (leakage current between the electrodes) needs to be low. Each leakage current is preferably $1 \times 10^{-25}$ A or lower, further preferably $1 \times 10^{-21}$ A or lower at a temperature when the transistor or capacitor is in use (e.g., 25° C.).

Voltage applied to the gate of the reading transistor is changed depending on voltage of the reading word line and is proportional to (capacitance of the capacitor)/(gate capacitance of the reading transistor+capacitance of the capacitor) in a state where there is no charge on the drain side of the writing transistor. Therefore, when the capacitance of the capacitor is larger than the gate capacitance of the reading transistor, appropriate voltage can be applied to the gate of the reading transistor with relatively low voltage of the reading word line. On the other hand, when the capacitance of the capacitor is smaller than the gate capacitance, higher voltage needs to be applied to the reading word line in order that the same voltage be applied to the gate of the reading transistor.

Therefore, the capacitance of the capacitor is preferably larger than or equal to the gate capacitance of the reading transistor, further preferably larger than or equal to two times as large as the gate capacitance of the reading transistor. The capacitance of the capacitor is preferably 10 fF or smaller so that the semiconductor memory device operates at high speed.

The writing word line, the writing bit line, the reading bit line, the bias line, and the reading word line are arranged in a matrix; the writing word line is preferably orthogonal to the writing bit line and the reading bit line is preferably parallel to the bias line so that matrix drive is performed. In addition, the writing word line is preferably parallel to the reading word line.

A memory cell having the above-described structure is illustrated in FIG. 1A. Here, a memory cell in the n-th row and the m-th column is described as an example. In FIG. 1A, a memory cell including a writing transistor Tr1($n,m$), a reading transistor Tr2($n,m$), and a capacitor C(n,m) is illustrated. Here, a drain of the writing transistor Tr1($n,m$) is connected to a gate of the reading transistor Tr2($n,m$) and one electrode of the capacitor C(n,m).

Further, a gate of the writing transistor Tr1($n,m$) is connected to a writing word line Qn; a source of the writing transistor Tr1($n,m$) is connected to a writing bit line Rm; a source of the reading transistor Tr2($n,m$) is connected to a reading bit line Om; a drain of the reading transistor Tr2($n,m$) is connected to a bias line Sm; and the other electrode of the capacitor C(n,m) is connected to a reading word line Pn.

In FIG. 1A, the writing word line Qn is parallel to the reading word line Pn and the writing bit line Rm, the reading bit line Om, and the bias line Sm are parallel to one another. Further, the writing word line Qn and the reading word line Pn are orthogonal to the writing bit line Rm, the reading bit line Om, and the bias line Sm.

In FIG. 1B, the memory cell in the n-th row and the m-th column and a portion around the memory cell are illustrated. As apparent from the diagram, two wirings per row and three wirings per column are needed; thus, (2N+3M) wirings are needed in a matrix of N rows and M columns.

FIG. 1A illustrates a circuit of the memory cell which is described as a gain cell in Patent Document 2. Memory cells of this kind have been developed because the capacitance of a capacitor therein can be sufficiently small as compared to that in DRAMs. That is, in a gain cell, the necessary capacitance of the capacitor is determined relative to the gate capacitance of a reading transistor, whereas in a DRAM, the necessary capacitance of the capacitor is determined relative to the parasitic capacitance of a bit line.

When the capacitance of the capacitor can be made small, time required for charging and discharging of the capacitor, i.e., a switching period can be short. In a DRAM, charging and discharging of the capacitor is a rate-limiting factor which leads to limitation on operation speed. On the other hand, in a gain cell, as a design rule is decreased, the gate capacitance of a reading transistor and the capacitance of a capacitor are decreased; thus, a memory capable of extremely fast response can be manufactured.

Specifically, when the design rule is decreased to one tenth, the capacitance of the capacitor is reduced to one tenth and on resistance of the transistor is reduced to one tenth; as a result, time required for switching is shortened to one hundredth. However, since the capacitance of the capacitor of a DRAM is not changed even when the on resistance of a transistor is reduced to one tenth, a switching time is reduced only to one tenth. In other words, a rate at which operation speed of a gain cell is increased can be approximately 10 times as high as a rate at which operation speed of a DRAM is increased.

As described above, gain cells are expected to have excellent characteristics; however, gain cells have not been put to practical use because leakage current between a source and a drain in a transistor cannot be sufficiently suppressed in the gain cells. In general, even when a design rule is decreased to one tenth, leakage current cannot be reduced to one tenth. In fact, leakage current is rather increased in some cases due to a variety of factors caused by miniaturization.

For instance, in a transistor in which a P-N junction is used for insulation, as the transistor is miniaturized, leakage current due to tunneling current between bands at the P-N junction is increased. Besides, in the case of a semiconductor with a small band gap (less than 2.5 electron volts), leakage current due to thermally excited carriers is also considerable. If leakage current cannot be suppressed, there is still difficulty in reducing the capacitance of the capacitor.

In the case of forming a known insulated gate transistor using silicon as a writing transistor of a gain cell, an advantage obtained by using two transistors becomes meaningless. For example, if the capacitance of the capacitor is approximately 10 fF similarly to a general DRAM, leakage current in the transistor using silicon in an off state is approximately $10^{-14}$ A at the lowest; therefore, charge stored in the capacitor is lost in one second or so. Thus, refreshing needs to be performed more than 10 times per second similarly to a general DRAM.

In the first place, the capacitance of the capacitor in a gain cell needs to be reduced because cost cannot be offset when a capacitor having the same capacitance is used in the gain cell in which one more transistor is provided than in a DRAM. Gain cells have a characteristic in that data can be read even when the capacitance of the capacitor is reduced to one tenth, for example.

However, when the capacitance of the capacitor is reduced to one tenth, an interval between refreshing operations is also reduced to one tenth. Thus, power consumption is increased and access to a memory is limited. Similarly, when the capacitance of the capacitor is reduced to one hundredth, an interval between refreshing operations is reduced to one hundredth, in which case the gain cell is not practical at all. Conventionally, leakage current in a writing transistor cannot be sufficiently reduced and thus such a gain cell has not been put to practical use.

Leakage current between a source and a drain of a writing transistor can be so low that it cannot be measured by an ordinary method in the case where the writing transistor is an insulated gate transistor which is formed using the above-described wide band gap semiconductor in its channel. By utilizing this fact, according to an embodiment of the present invention, a gain cell can be a practical memory cell.

A gain cell can be an extremely promising memory cell when leakage current in a transistor is sufficiently low. That is, since the capacitance of a capacitor can be as small as the gate capacitance of a writing transistor or a reading transistor, a capacitor in a special shape (a stack capacitor or a trench capacitor) which are used in a DRAM need not to be provided, whereby the degree of freedom for design is increased and the process is made simpler. In addition, a memory can be manufactured in which an operation speed is increased as described above.

For example, when leakage current is one hundred thousandth (approximately $10^{-20}$ A) of that in a silicon transistor, an interval between refreshing operations can be one thousand times as long as that in a DRAM (i.e., refreshing is performed once per minute) even when the capacitance of a capacitor is one thousandth of that in a DRAM. When leakage current is lower, for example, $10^{-24}$ A or lower, refreshing may be performed once every few days.

Writing in such a gain cell means charging of a capacitor having much smaller capacitance than that in a DRAM as described above; therefore, even when the characteristics of a writing transistor, which mean on-state current, mobility, or the like thereof, are not so excellent, writing can be performed as fast as that performed in an existing DRAM. For example, in the case where the capacitance of the capacitor illustrated in FIG. 1A is one thousandth of that of a capacitor of a DRAM, on-state current (or mobility) in the writing transistor may be one thousandth of that in a transistor of the DRAM.

Even if the mobility of the writing transistor is one hundredth of that of a transistor using silicon, writing can be performed at a speed 10 times as high as in an ordinary DRAM. As described above, higher speed can be realized as the design rule is decreased.

An example of operation of the circuit illustrated in FIG. 1A is described below. In order that data be written in the memory cell illustrated in FIG. 1A, the writing transistor Tr1($n,m$) is turned on by applying appropriate potential to the writing word line Qn. By the potential of the writing bit line Rm at that time, charge is injected to the drain side of the writing transistor Tr1($n,m$). The amount of the charge injected at that time is determined depending on the potential of the writing bit line Rm, the gate capacitance of the reading transistor Tr2($n,m$), the capacitance of the capacitor C(n,m), and the like and the result is thus always almost the same in the case where the conditions are the same, and variation is small. In this manner, data is written.

Then, by applying different appropriate potential to the writing word line Qn, the writing transistor Tr1($n,m$) is turned off. Even in this state, the charge on the drain side of the writing transistor Tr1($n,m$) is held. The charge is held even after the power supply to the matrix is stopped.

When the data is read, appropriate potential is applied to the reading word line Pn and a state of the reading transistor Tr2($n,m$) is monitored. For example, the following two states are considered as data: a state where there is no charge on the drain side of the writing transistor Tr1($n,m$); and a state where there is positive charge on the drain side of the writing transistor Tr1($n,m$).

It is also assumed that the reading transistor Tr2($n,m$) is an n-channel transistor; the bias line Sm is held at appropriate positive potential; and appropriate potential lower than or equal to the threshold value of the reading transistor Tr2($n,m$) is applied to the reading word line Pn.

In the state where there is no charge, since the potential of the gate of the reading transistor Tr2($n,m$) is lower than or equal to the threshold value, the reading transistor Tr2($n,m$) is in an off state. Thus, resistance between the source and the drain is extremely high. Therefore, the potential of the reading bit line Om is largely different from the potential of the bias line Sm. However, when there is positive charge on the drain side of the writing transistor Tr1($n,m$), the reading transistor Tr2($n,m$) can be turned on in some cases even when the potential of the reading word line Pn is lower than the threshold value; accordingly, the potential of the reading bit line Om is the same as or extremely close to the potential of the bias line Sm in some cases. In this manner, what data is held can be known.

With the use of the same principle, a stage to which the amount of the charge stored in one memory cell corresponds can be known. A circuit at the time of reading is equivalently illustrated in FIG. 4A. By changing the potential of the writing bit line Rm at the time of writing, a value of charge Q is at four stages (Q0, Q1, Q2, and Q3, where Q0<Q1<Q2<Q3). At the time of reading, the writing transistor Tr1($n,m$) can be regarded as an insulator and thus is omitted together with the writing word line Qn and the writing bit line Rm from the diagram.

In accordance with the value of the charge Q, apparent characteristics of the reading transistor Tr2($n,m$) are changed. When the potential of the reading bit line Om is 0, the potential of the bias line Sm is $V_{SH}$ (>0), and the potential of the reading word line Pn is changed, the amount of current flowing in the reading transistor Tr2($n,m$) is changed. The state is illustrated in FIG. 4B.

In the case where the largest amount of charge is held (Q=Q3), even when $V_g$ is negative, a sufficiently large amount of current flows and the reading transistor Tr2 is turned on. For example, the reading transistor Tr2 is turned on when $V_g=V_{P1}$. In order to turn the reading transistor Tr2 off, $V_g$ needs to be a sufficiently large negative value (e.g., $V_{PL}$). The second curve from the left shows a case where the amount of charge is the second largest (Q=Q2). At this time, the reading transistor Tr2 is in an off state when $V_g=V_{P1}$. On the other hand, the reading transistor Tr2 is turned on when $V_g=V_{P2}$. The third curve from the left shows a case where the amount of charge is the third largest (Q=Q1). At this time, the reading transistor Tr2 is in an off state when $V_g=V_{P2}$ but turned on when $V_g=V_{P3}$. In the case where Q=Q0, the reading transistor Tr2 is in an off state even when $V_g=V_{P5}$.

That is, by applying potential at some levels to the reading word line Pn, the amount of the charge held can be known. At first, $V_g=V_{PL}$. In this case, the reading transistor Tr2 is in an off state regardless of the amount of the charge held. Then, when $V_g=V_{P1}$, the reading transistor Tr2 is turned on only when the amount of the charge held is Q3. If the reading transistor Tr2 is turned on at this stage, it can be judged that the amount of the charge held is Q3.

When $V_g=V_{P2}$, the reading transistor Tr2 is turned on only when the amount of the charge held is Q3 or Q2. If the reading transistor Tr2 is turned on for the first time at this stage, it can be judged that the amount of the charge held is Q2.

When $V_g=V_{P3}$, the reading transistor Tr2 is turned on only when the amount of the charge held is Q3, Q2, or Q1. If the reading transistor Tr2 is turned on for the first time at this stage, it can be judged that the amount of the charge held is Q1. If the reading transistor Tr2 is not turned on even at this stage, it can be judged that the amount of the charge is Q0. In this manner, the data (2 bits) at four stages can be written and read. Needless to say, in a similar manner, much more data such as data (3 bits) at eight stages or data (4 bits) at 16 stages can be written and read.

As described above, in order that much data be stored by making the amount of the charge held in the memory cell be at a plurality of stages, it is necessary that a variation in the amount of the charge held is small. This is because when the variation in the amount of the charge is large, each gap between $V_{PL}, V_{P1}, V_{P2},$ and $V_{P3}$ in FIG. 4B needs to be made larger. The matrix type semiconductor memory device according to the first embodiment of the present invention is suitable for this purpose because a variation in the amount of the charge held is small.

In a second embodiment of the present invention, the reading word line in the above-described first embodiment of the present invention is replaced with the writing word line in another row. A memory cell having such a structure is illustrated in FIG. 5A. Here, the memory cell in the n-th row and the m-th column is described as an example. In FIG. 5A, the memory cell including the writing transistor Tr1($n,m$), the reading transistor Tr2($n,m$), and the capacitor C(n,m) is illustrated. The drain of the writing transistor Tr1($n,m$) is connected to the gate of the reading transistor Tr2($n,m$) and one electrode of the capacitor C(n,m).

Further, the gate of the writing transistor Tr1($n,m$) is connected to the writing word line Qn; the source of the writing transistor Tr1($n,m$) is connected to the writing bit line Rm; the source of the reading transistor Tr2($n,m$) is connected to the reading bit line Om; the drain of the reading transistor Tr2($n,m$) is connected to the bias line Sm; and the other electrode of the capacitor C(n,m) is connected to a writing word line Qn–1 in one row before the n-th row.

In FIG. 5B, the memory cell in the n-th row and the m-th column and a portion around the memory cell are illustrated. As apparent from the diagram, one wiring per row and three wirings per column are needed; thus, (N+3M+1) wirings are needed in a matrix of N rows and M columns. The reading word line of the first embodiment of the present invention is replaced with the writing word line in another row, whereby the number of wirings can be made smaller than that of the first embodiment of the present invention.

In a third embodiment of the present invention, the writing bit line is substituted for the reading, bit line in the above-described second embodiment of the present invention. A memory cell having such a structure is illustrated in FIG. 10A. Here, the memory cell in the n-th row and the m-th column is described as an example. In FIG. 10A, the memory cell including the writing transistor Tr1($n,m$), the reading transistor Tr2($n,m$), and the capacitor C(n,m) is illustrated. The drain of the writing transistor Tr1($n,m$) is connected to the gate of the reading transistor Tr2($n,m$) and one electrode of the capacitor C(n,m).

Further, the gate of the writing transistor Tr1($n,m$) is connected to the writing word line Q77; the source of the writing transistor Tr1($n,m$) is connected to the writing bit line Rm; the source of the reading transistor Tr2($t,m$) is also connected to the writing bit line Rm; the drain of the reading transistor Tr2($n,m$) is connected to the bias line Sm; and the other electrode of the capacitor C(n,m) is connected to the writing word line Qn–1 in one row before the n-th row.

In FIG. 10B, the memory cell in the n-th row and the m-th column and a portion around the memory cell are illustrated. As apparent from the diagram, one wiring per row and two wirings per column are needed; thus, (N+2M+1) wirings are needed in a matrix of N rows and M columns. The writing bit line is substituted for the reading bit line of the first embodiment of the present invention, whereby the number of wirings can be made smaller than that of the first embodiment of the present invention.

Although the three structures are described above as means for achieving the objects, a different solution is also disclosed in this specification. Further, the objects can be achieved also by making modifications obvious to those skilled in the art to the above three structures or any means for achieving the objects which is disclosed in this specification. Therefore, means for achieving the objects are not limited to the above three structures.

By employing any of the above-described structures, at least one of the above-described objects can be achieved. In each of the above structures, since writing is performed by ordinarily turning a transistor on or off, the problem of deterioration of an insulating film cannot occur. Therefore, the number of writing times in the above structures can be large. By optimizing conditions, even after performing writing a billion times, change in main characteristics of a transistor (threshold voltage, on-state current, and an S value) which is measured is in the range of measurement error or is only less than 1%.

FIG. 14 is a graph showing change in the threshold value of a transistor due to rewriting in a memory cell of a conventional FGNVM and that in a memory cell of the first embodiment of the present invention. In the memory cell of the FGNVM, when the number of rewriting times exceeds 1000, the threshold value obviously starts to change regardless of whether data "0" is written (i.e., an electron is not injected to the floating gate) or data "1" is written (i.e., an electron is injected to the floating gate). When the number of rewriting times is 10000, the difference between the threshold value when data "0" is written and the threshold value when data "1" is written is 3 volts or less. On the other hand, in the memory cell of the first mode of the present invention, no obvious change from the beginning can be seen even after rewriting is performed a billion times.

FIG. 15 is a graph showing change in the conductance of a transistor due to rewriting in a memory cell of a conventional FGNVM and that in a memory cell of the first embodiment of the present invention. In the memory cell of the FGNVM, when the number of rewriting times exceeds 100, the conductance obviously starts to decrease. When the number of rewriting times is 10000, the conductance is 20% or less of that of the beginning. This means that on resistance of the transistor is increased. In other words, response speed of the memory cell decreases as the number of rewriting times increases. On the other hand, in the memory cell of the first embodiment of the present invention, no obvious change from the beginning can be seen even after rewriting is performed a billion times. Thus, there is substantially no limit on the number of rewriting times in the semiconductor memory device according to an embodiment of the present invention.

An embodiment of the present invention also shows excellent characteristics related to a period during which data can be stored. Charge can be held for 10 hours or longer, preferably 100 hours or longer by making leakage current between the source and the drain of the transistor in an off state which is used, gate leakage current, and internal leakage current in the capacitor meet the above-described conditions. Moreover, by optimizing conditions, charge can be held for one month or longer, or one year or longer.

In the case where the charge is reduced due to the leakage current, refreshing may be performed similarly to a conventional DRAM; an interval between refreshing operations is determined depending on a period during which the charge can be held. In the case where the charge is held for such a long period as described above, refreshing is necessary, for example, only once a month or once a year. Frequent refreshing which is needed in a conventional DRAM is not necessary and thus power consumption of a semiconductor memory device is reduced.

In the semiconductor memory device of an embodiment of the present invention, data is not lost even when reading of data is performed. Such a feature could be realized only in an SRAM; however, in the semiconductor memory device according to an embodiment of the present invention, the number of transistors used in one memory cell is five or less, typically two, which is smaller than that in the case of a conventional SRAM. Furthermore, when one of the transistors is formed using an oxide semiconductor in a thin film shape, an increased integration degree can be obtained because the transistor can be stacked over a conventional silicon semiconductor.

In an embodiment of the present invention, an absolute value of necessary capacitance for a memory cell can be reduced. In a DRAM, for example, the capacitance of a capacitor needs to be at least 30 fF because operation is interfered with if the capacitance is smaller than or equal to the wiring capacitance. However, capacitance is proportional to the area. In the case where the integration degree is increased, the area of one memory cell decreases; thus, necessary capacitance cannot be secured.

On the other hand, the capacitance of the capacitor in an embodiment of the present invention can be determined relative to the gate capacitance of the reading transistor. That is, as the integration degree is increased, the gate capacitance of the reading transistor is decreased; therefore, the capacitance necessary in the capacitor is also decreased in the same proportion. Therefore, even when the integration degree is increased, a capacitor having basically the same structure can be used.

Further, in a semiconductor memory device having the above-described structure, high voltage, which is needed for writing and erasing in an FGNVM, is not needed. Among FGNVMs, a so-called flash memory (especially a NAND-type flash memory) is superior to an SRAM and a DRAM in view of the integration degree; however, in order that data in even one memory cell be rewritten, data in a predetermined region needs to be collectively erased with the use of high voltage. In this point, in the semiconductor memory device according to an embodiment of the present invention, rewriting is performed per row and thus completes through the minimum necessary operation.

Further, since at the time of writing, charge is injected to the floating gate in one direction in a thermal non-equilibrium state in an FGNVM, a variation in the amount of charge is large. Data at a plurality of stages which depends on the amount of the charge held in the floating gate can be stored. However, when the variation in the amount of the charge is considered, data at around four stages (2 bits) is general. Higher voltage needs to be used in order that data of a larger number of bits be stored.

On the other hand, charge is reversibly injected in an embodiment of the present invention and thus a variation is small; for example, a variation in the threshold value among transistor characteristics which is illustrated in FIG. 4B can be 0.5 volts or smaller. Thus, data at more stages can be held in one memory cell within a narrower voltage range; consequently, voltage for writing or reading can be lower. For example, voltage used for writing or reading data of 4 bits (16 stages) can be 10 volts or lower.

Since voltage used is relatively low in an embodiment of the present invention, a phenomenon such as interference with an adjacent element or leakage of a signal to an adjacent element is less likely to occur than in an FGNVM, and in addition, the length of one side of one memory cell can be as small as 10 nm in simulation.

In order to further increase such an effect, an S value of a transistor used may be greater than or equal to 59 mV/dec and less than or equal to 70 mV/dec, preferably greater than or equal to 59 mV/dec and less than or equal to 63 mV/dec at a temperature when the transistor is in use. In this manner, a variation in threshold values in the whole semiconductor memory device can be reduced, which is a matter of course.

In particular, when the writing transistor has an S value in the above range, a variation in the amount of charge at the time of writing data becomes small. In addition, when the reading transistor has an S value in the above range, the potential to be applied to the reading word line at the time of reading can be set with a short interval. These features are advantageous in the case of dealing with multivalued data in a semiconductor memory device.

BEST MODE FOR CARRYING OUT THE INVENTION

Figure 1A:
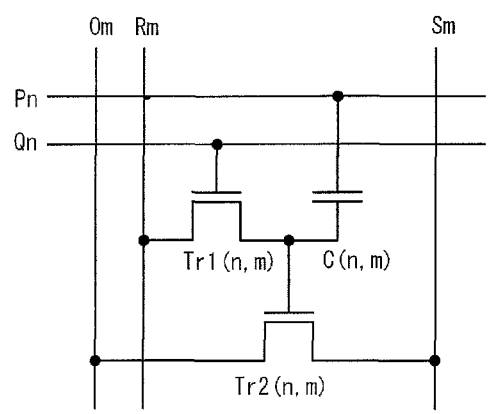
FIGS. 1A and 1B are diagrams illustrating a semiconductor memory device according to an embodiment of the present invention.

Hereinafter, embodiments will be described with reference to drawings. However, the embodiments can be implemented in various different ways. It will be readily appreciated by those skilled in the art that modes and details can be changed in various ways without departing from the spirit and scope of the present invention. Therefore, the present invention is not interpreted as being limited to the description of the embodiments below. Note that in structures of the invention described below, the same portions or portions having similar functions are denoted by the same reference numerals, and description thereof is not repeated.

Further, in the embodiments described below, for easy understanding, timing, width, height, or the like of a pulse is explained to have a fixed value; however, in consideration of the spirit of the present invention, it can be easily understood that the timing of the pulse is not necessarily synchronized or the width or height of the pulse is not necessarily fixed.

Embodiment 1

Figure 1B:
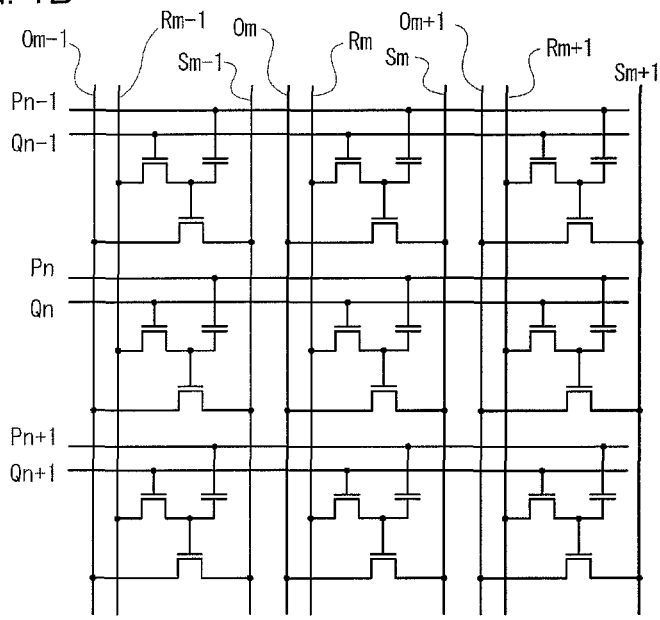

In this embodiment, operation of a semiconductor memory circuit illustrated in FIGS. 1A and 1B is described. Here, both the writing transistor Tr1 and the reading transistor Tr2 are n-channel transistors. First, a writing method is described with reference to FIGS. 2A and 2B. At the time of writing, the reading bit lines (..., Om−1, Om, Om+1, ...), the bias lines (..., Sm−1, Sm, Sm+1, ...), and the reading word lines (..., Pn−1, Pn, Pn+1, ...) are held at constant potential. Although potential may be different depending on the kind of a wiring, the potential of any wiring is set to 0 volts here.

Figure 2A:
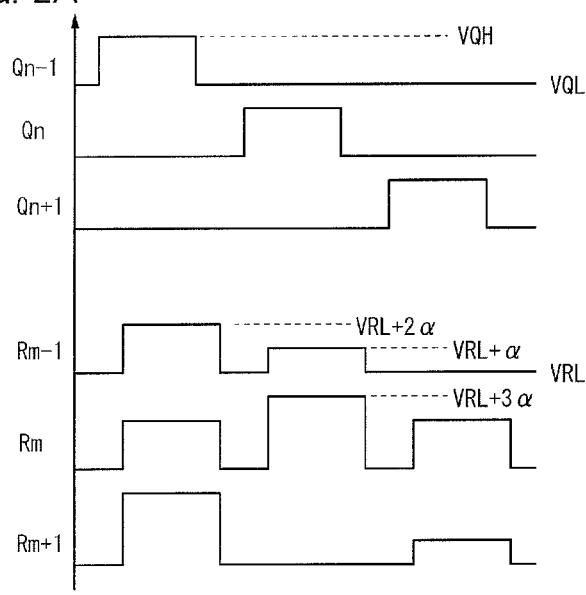
FIGS. 2A and 2B are diagrams illustrating a driving method (writing) of a semiconductor memory device according to an embodiment of the present invention.

In this state, a pulse is sequentially applied to the writing word lines (..., Qn−1, Qn, Qn+1, ...) so that the writing transistor is turned on/off. Here, the potential of the writing word line when the pulse is not applied is $V_{QL}$ and potential of the pulse is $V_{QH}$. As illustrated in FIG. 2A, by sequentially applying the pulse in each row, the writing transistor is turned on/off per row. A time for which the pulse continues may be determined in consideration of the characteristics of the writing transistor.

Although periods during which the pulse is applied are prevented from overlapping with each other in the diagram, for example, a period during which a pulse is applied to Qn−1 may partly overlap with a period during which a pulse is applied to Qn. In addition, $V_{QL}$ needs to be lower than or equal to the threshold value of the writing transistor Tr1 and can be set to −2 volts, for example. Further, $V_{QH}$ needs to be higher than or equal to the threshold value of the writing transistor Tr1 and can be set to +2 volts, for example.

At the same time, a signal is applied to the writing bit lines (..., Rm−1, Rm, Rm+1, ...). The signal applied to the writing bit lines includes a plurality of pulses and the height of the pulses can be various. Here, the pulses have four levels of heights $V_{RL}$, $V_{RL+\alpha}$, $V_{RL+2\alpha}$, and $V_{RL+3\alpha}$ ($\alpha>0$). These pulses are not always completely synchronized with the pulses applied to the writing word line. For example, the pulses to the writing bit lines are preferably applied after a predetermined period ($\tau_1$) after application of the pulses to the writing word lines. Further, application of the pulses to the writing bit lines is preferably stopped after a predetermined period ($\tau_2$) after application of the pulses to the writing word lines is stopped. Here, $\tau_1$ and $\tau_2$ may be set so that $\tau_1<\tau_2$ or $\tau_1>\tau_2$; however, for design of a circuit, it is preferable that they are set so that $\tau_1=\tau_2$.

Figure 2B:
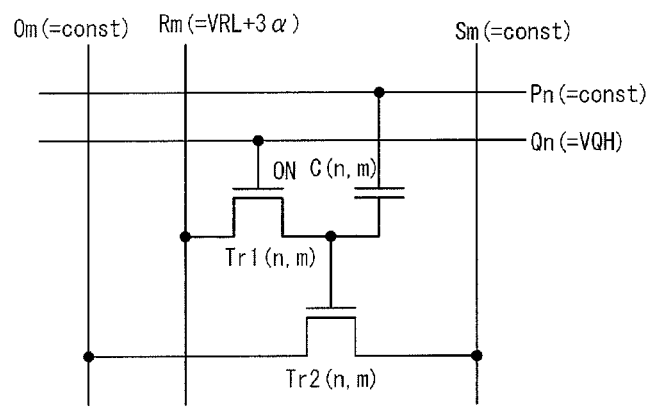

A state of the memory cell in the n-th row and the m-th column is illustrated in FIG. 2B. Here, the potential of the writing word line Qn is $V_{QH}$ and the writing transistor Tr1(n, m) is thus in an on state. Therefore, the drain of the writing transistor Tr1(n,m) (i.e., the gate of the reading transistor Tr2(n,m)) is at the potential $V_{RL+3\alpha}$ of the writing bit line Rm at the time or at potential close to this potential.

In this manner, potential in each memory cell is determined. Based on the potential in each memory cell, the amount of charge generated on the drain side of each of the writing transistors Tr1 is determined. Here, the amount of charge in each of the memory cells is shown in Table 1 when the amount of charge corresponding to the potential $V_{RL}$ is Q0, that corresponding to the potential $V_{RL+\alpha}$ is Q1, that corresponding to the potential $V_{RL+2\alpha}$ is Q2, and that corresponding to the potential $V_{RL+3\alpha}$ is Q3.

TABLE 1

|  | (m − 1)-th column | m-th column | (m + 1)-th column |
| --- | --- | --- | --- |
| (n − 1)-th column | Q2 | Q2 | Q3 |
| n-th column | Q1 | Q3 | Q0 |
| (n + 1)-th column | Q0 | Q2 | Q1 |

Figure 4A:
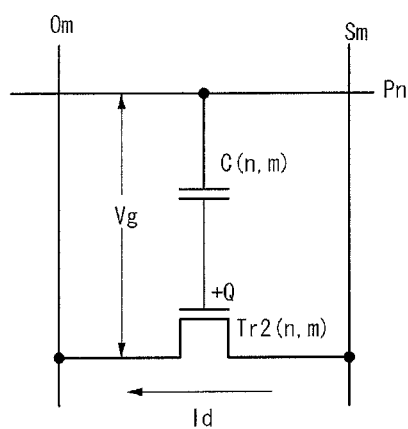
FIGS. 4A and 4B are diagrams illustrating a principle of reading data at a plurality of stages in an embodiment of the present invention.
Figure 4B:
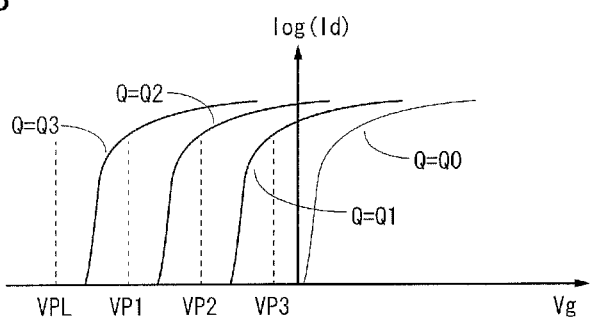

The amount of charge Q0, the amount of charge Q1, the amount of charge Q2, and the amount of charge Q3 correspond to those already described with reference to FIG. 4B. The above charge can be held for an extremely long time (10 hours or longer) even after the power supply to the semiconductor memory device is stopped.

Next, a reading method is described with reference to FIGS. 3A and 3B. As illustrated in FIG. 3B, at the time of reading, constant potential is applied to the writing word lines ( . . . , Qn−1, Qn, Qn+1, . . . ) and the writing bit lines ( . . . , Rm−1, Rm, Rm+1, . . . ). It is necessary to apply potential lower than or equal to the threshold value of the writing transistor to the writing word lines. Although the potential of the writing word line is held at $V_{QL}$ and the potential of the writing bit line is held at $V_{RL}$ here, the lines may be held at another potential. Further, the bias lines ( . . . , Sm−1, Sm, Sm+1, . . . ) are also held at constant potential $V_{SH}$. The potential $V_{SH}$ can be set to, for example, +2 volts. In addition, a load (a resistor) with an appropriate magnitude is connected to an end of the reading bit lines ( . . . , Om−1, Om, Om+1, . . . ) and an end of the load is held at constant potential (0 V here).

The potential of the reading word lines is held at $V_{PL}$ except when a pulse is applied. Then, as illustrated in FIG. 3A, pulses are sequentially applied to the reading word lines ( . . . , Pn−1, Pn, Pn+1, . . . ). First, the height of the pulse is $V_{P1}$ and the potential of the reading word lines ( . . . , Pn−1, Pn, Pn+1, . . . ) is sequentially set to the initial potential $V_{PL}$ after a predetermined period. After the pulse is applied to all the rows, a pulse at a height of $V_{P2}$ is sequentially applied to the reading word lines. Then, a pulse at a height of $V_{P3}$ is sequentially applied to the reading word lines. In this manner, reading is performed. In the above description, $V_{PL}$, $V_{P1}$, $V_{P2}$, and $V_{P3}$ correspond to those already described with reference to FIG. 4B.

Through the above steps, the reading transistor Tr2 is turned on in some cases by the application of the pulse. For example, as already described with reference to FIG. 4B, it is the reading transistor Tr2 of a memory cell in which the amount of charge is Q3 that is turned on with the pulse at the height of $V_{P1}$, which is the lowest; therefore, which of the memory cells has the amount of charge Q3 can be specified by observing the potential of the reading bit lines ( . . . , Om−1, Om, Om+1, . . . ). This is because when the reading transistor Tr2 is turned on, the potential of the reading bit line becomes the same as or close to the potential of the bias line.

Figure 3A:
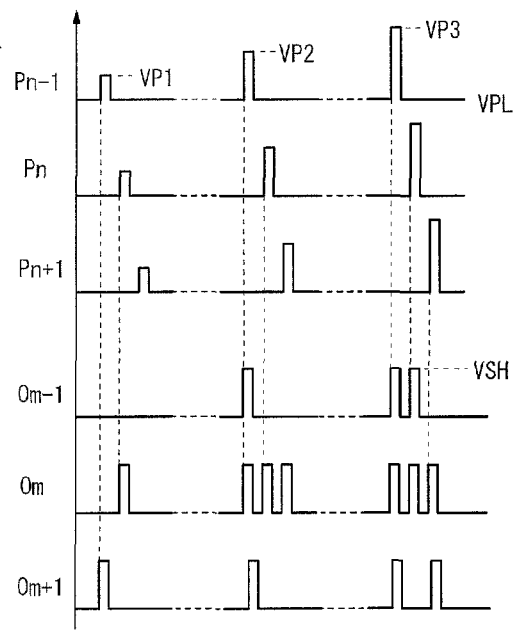
FIGS. 3A and 3B are diagrams illustrating a driving method (reading) of a semiconductor memory device according to an embodiment of the present invention.
Figure 3B:
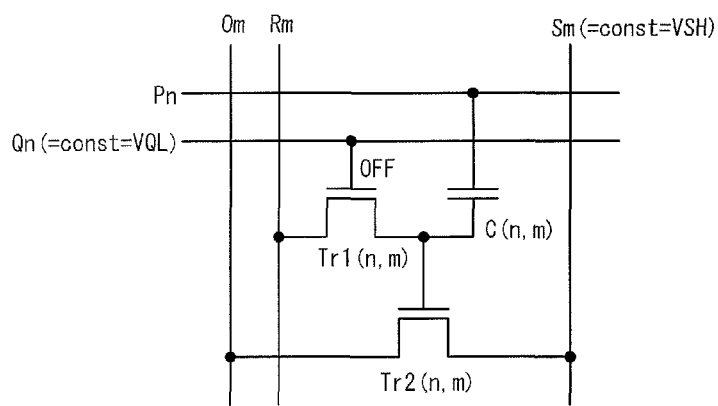

In FIG. 3A, at the time when a pulse is applied to the reading word line Pn−1, the potential of the reading bit line Om+1 is increased (a pulse is generated); at the time when a pulse is applied to the reading word line Pn, the potential of the reading bit line Om is increased. From this fact, it can be specified that the amount of charge in a memory cell in the (n−1)-th row and the (m+1)-th column and the amount of charge in the memory cell in the n-th row and the m-th column are Q3.

Then, in the case where a pulse at the height of $V_{P2}$ is applied to the reading word line, a reading transistor of a memory cell in which the amount of charge is Q3 or Q2 is turned on, thus, in a similar manner, which of the memory cells has the amount of charge of Q3 or Q2 can be known. Similarly, also in the case where a pulse at the height of $V_{P3}$ is applied to the reading word line, the potential of the reading bit line is changed depending on the amount of charge.

Reading is thus completed. The number of times of generating a pulse in each memory cell is recorded, whereby data written in the memory cell can be known. For example, according to FIG. 3A, in the memory cell in the n-th row and the m-th column, a pulse is generated three times for one reading operation. This is because the charge held is Q3 so that the reading transistor Tr2 is turned on in response to all the pulses which are applied to the reading word line Pn, and the reading bit line Om has the same potential as the bias line Sm or the potential of the reading bit line Om becomes close to the potential of the bias line Sm.

On the other hand, in a memory cell in the (n+1)-th row and the (m−1)-th column, no pulse is generated. This is because the amount of charge in the memory cell is Q0 that is the smallest and the reading transistor Tr2 is not turned on even with the pulse at the height of $V_{P3}$ that is the highest pulse. Results of adding up the number of pulses generated in each of the memory cells in this manner are shown in Table 2. In this manner, data stored in each memory cell can be read. Although data is sequentially read per row in the above example, it is also possible to read only data in a specific memory cell in a similar manner.

TABLE 2

|  | (m − 1)-th column | m-th column | (m + 1)-th column |
| --- | --- | --- | --- |
| (n − 1)-th column | 2 | 2 | 3 |
| n-th column | 1 | 3 | 0 |
| (n + 1)-th column | 0 | 2 | 1 |

Embodiment 2

Figure 5A:
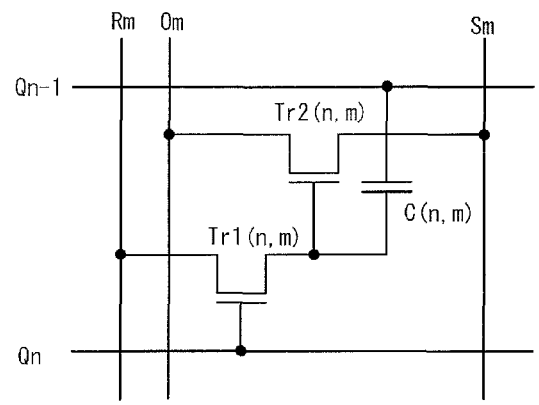
FIGS. 5A and 5B are diagrams illustrating a semiconductor memory device according to an embodiment of the present invention.
Figure 5B:
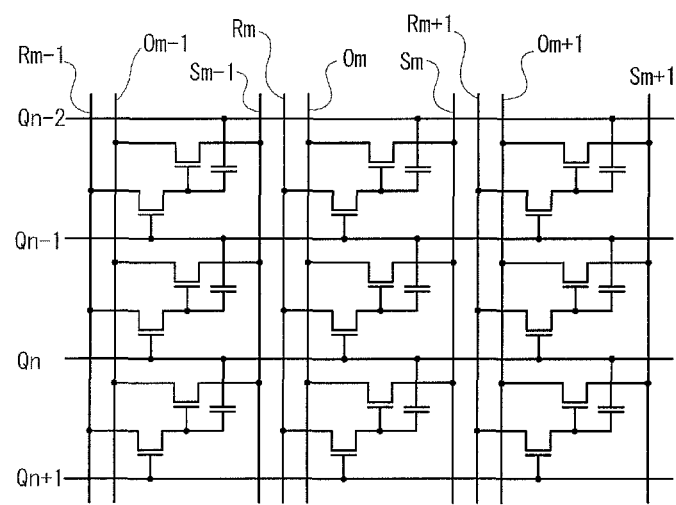

In this embodiment, operation of a semiconductor memory circuit illustrated in FIGS. 5A and 5B is described. Here, both the writing transistor Tr1 and the reading transistor Tr2 are n-channel transistors. In this embodiment, the reading word line is replaced with the writing word line in another row in Embodiment 1. As described above, by employing this structure, the number of wirings of a semiconductor memory device can be smaller than that in Embodiment 1. In this embodiment, the writing word line in the (n−1)-th row is substituted for the reading word line in the n-th row.

A writing method is basically the same as the writing method in Embodiment 1. The reading bit lines ( . . . , Om−1, Om, Om+1, . . . ) and the bias lines ( . . . , Sm−1, Sm, Sm+1, . . . ) are held at constant potential. Although the potential may be different between the kinds of wirings, it is desirable that the potential of the reading bit line be equal to that of the bias line in each column in order to prevent current from flowing between a source and a drain of the reading transistor. Here, the potential of each line is set to +3 volts.

Note that, under such conditions, depending on the potential of the drain of the writing transistor Tr1 (i.e., the potential of the gate of the reading transistor Tr2), the reading transistor Tr2 is always in an off state. For example, when $V_{RL+3\alpha}$ is +3 volts or less. time when the reading transistor Tr2 is in an off state is long.

Then, a pulse is sequentially applied to the writing word lines (..., Qn−1, Qn, Qn+1, ...) as illustrated in FIG. 2A so that the writing transistor is turned on/off. At the same time, a signal is applied to the writing bit lines (..., Rm−1, Rm, Rm+1, ...) so that data is written in a memory cell. The wave height $V_{QH}$ of the pulse applied to the writing word line is set to +3 volts and $V_{QL}$ is set to −3 volts, for example. $V_{RL}$ is set to 0 volts. The amount of charge held in each memory cell is similar to that described in Embodiment 1, which is shown in Table 1.

Next, a reading method is described with reference to FIGS. 6A and 6B. Although data is sequentially read per row in an example below, it is also possible that only data in a specific memory cell is read in a similar manner. As illustrated in FIG. 6B, at the time of reading, constant potential $V_{RL}$ is applied to the writing bit lines (..., Rm−1, Rm, Rm+1, ...). Further, the bias lines (..., Sm−1, Sm, Sm+1, ...) are also held at constant potential $V_{SH}$. Each of the potential $V_{RL}$ and the potential $V_{SH}$ can be set to, for example, 0 volts.

Pulses are applied to the writing word lines (..., Qn−1, Qn, Qn+1, ...). The pulses have three stages of wave heights which are illustrated in FIG. 4B as $V_{P1}$, $V_{P2}$, and $V_{P3}$ ($V_{P1} < V_{P2} < V_{P3}$) and $V_{P3}$ is preferably lower than the potential of the writing bit lines (..., Rm−1, Rm, Rm+1, ...). Further, the potential of the writing word lines is preferably $V_{PL}$ when a pulse is not applied. For example, each height can be set as follows: $V_{PL} = -6$ [volt], $V_{P1} = -5$ [volt], $V_{P2} = -4$ [volt], and $V_{P3} = -3$ [volt].

A group of three pulses, the potential of which is set in a stage-by-stage manner, is sequentially applied to the writing word lines. It is to be noted here that although the writing word line is connected to the gate of the writing transistor, the writing transistor is not turned on when the following conditions are met. Therefore, the charge held in the capacitor clues not leak at the time of reading.

As described above, the maximum potential of the pulse applied to the writing word line is −3 volts and the potential of the writing bit line connected to the source of the writing transistor is 0 volts; thus, when the potential of the gate of the writing transistor and that of the source are compared, the former is lower than the latter.

On the other hand, when the potential of the gate of the writing transistor is higher than that of the drain, the writing transistor is turned on and the charge held in the capacitor leaks. It is to be noted that the potential of the drain of the writing transistor is affected via the capacitor by change in the potential of the writing word line in the preceding row so as to be different from the potential at the time of writing. In consideration of such change in the potential, conditions at the time of writing or reading need to be set in such a manner that the potential of the drain of the writing transistor is always lower than the potential of the gate of the writing transistor.

On condition that there is no parasitic capacitance in the writing transistor and the reading transistor, ($V_{RL} - V_{QL} - V_{P3} + V_{PL}$) may be 0 or more. Since this condition is met when $V_{RL} = 0$ [volt], $V_{QL} = -3$ [volt], $V_{PL} = -6$ [volt], and $V_{P3} = -3$ [volt] as described above, the charge held in the memory cell does not leak from the writing transistor due to a pulse applied to the writing word line.

Figure 6A:
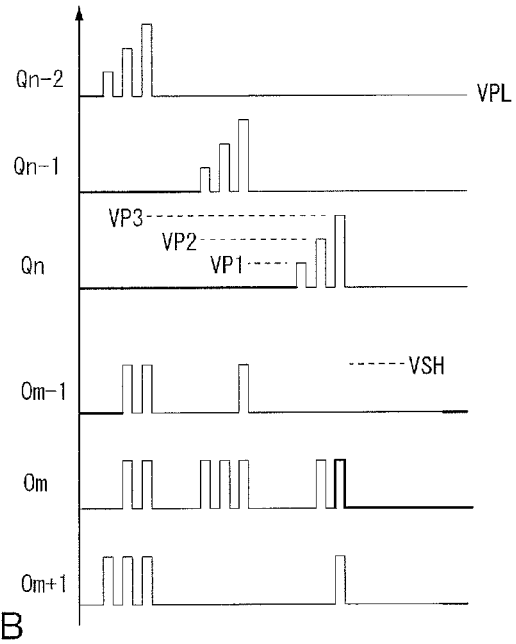
FIGS. 6A and 6B are diagrams illustrating a driving method (reading) of a semiconductor memory device according to an embodiment of the present invention.
Figure 6B:
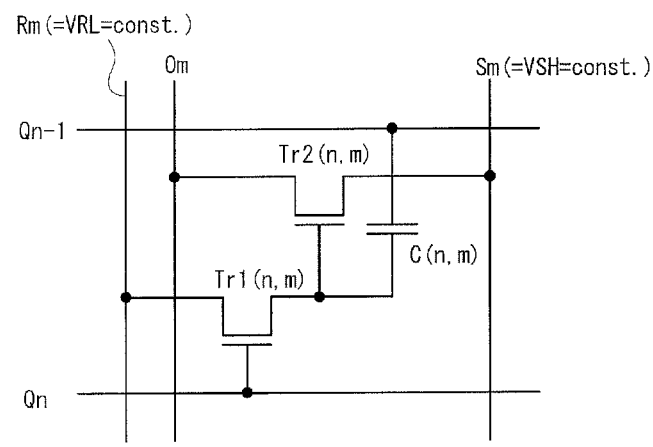

As illustrated in FIG. 6A, pulses are sequentially applied to the writing word lines (..., Qn−2, Qn−1, Qn, ...). It is to be noted that data stored in the memory cells in the n-th row is obtained at the time of applying a pulse to the writing word line in the (n−1)-th row. Similarly to Embodiment 1, a state (all on state or an off state) of the reading transistor Tr2 is changed depending on the amount of charge held on the drain side of the writing transistor Tr1.

Similarly to Embodiment 1, by monitoring the potential of the reading bit line, a state (an on state or an off state) of the reading transistor in response to a pulse applied to the writing word line in the preceding row can be known. For example, in order that a state of the reading transistor of the memory cell in the n-th row and the m-th column be known, the potential of the reading bit line Om at the time of applying a pulse to the writing word line Qn−1 in FIG. 5A or 5B may be monitored.

In the case where the amount of charge in this memory cell is Q3, which is the largest, the reading transistor is turned on even with the lowest pulse. The potential of the reading bit line changes three times while three pulses are applied; therefore, three pulses can be observed. On the other hand, in the case where the amount of the charge is Q0, which is the smallest, the reading transistor is not turned on even with the highest pulse; therefore, any pulse is not observed. In this manner, the number of pulses is counted, whereby the amount of charge held in each memory cell, i.e., data, can be known.

Embodiment 3

In this embodiment, a shape and a manufacturing method of the semiconductor memory device described in Embodiment 2 are described. In this embodiment, an oxide semiconductor containing zinc and indium is used for the writing transistor and a single crystal silicon semiconductor is used for the reading transistor. Therefore, the writing transistor is stacked over the reading transistor.

That is, an insulated gate transistor using a single crystal silicon semiconductor which is provided over a single crystal silicon substrate is used as the reading transistor and a transistor in which an oxide semiconductor is used for a semiconductor layer is formed thereover as the writing transistor. Note that although an example in which a semiconductor memory device is formed over a single crystal silicon substrate is described in this embodiment, the semiconductor memory device can be provided over another kind of semiconductor substrate or an insulating substrate, alternatively.

Figure 7A:
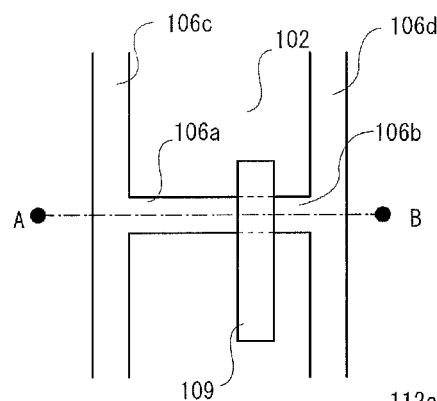
FIGS. 7A to 7C are diagrams each illustrating layout and the like of wirings of a semiconductor memory device according to an embodiment of the present invention.
Figure 7B:
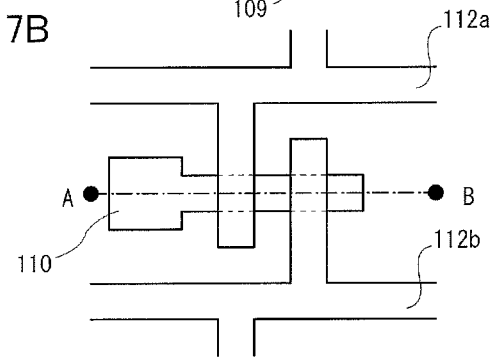
Figure 7C:
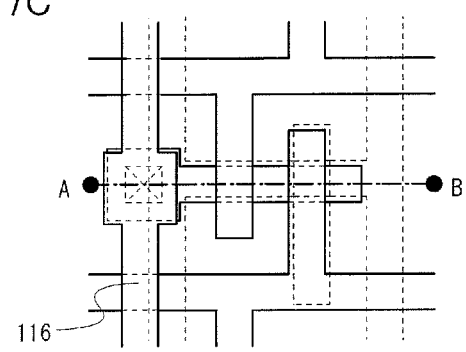

An example of layout of a memory cell of the semiconductor memory device in this embodiment is illustrated in FIGS. 7A to 7C. In FIG. 7A, main wirings, main electrodes, and the like provided over a single crystal silicon substrate are illustrated. An element separation region 102 is formed over the substrate. A wiring 106c and a wiring 106d which contain a conductive material, doped silicon, or the like are formed in the region other than the element separation region 102 and partly serve as a source 106a and a drain 106b of the reading transistor, respectively. The wirings 106c and 106d serve as a reading bit line and a bias line, respectively. The source 106a and the drain 106b are separated from each other with a gate electrode 109 of the reading transistor.

Main wirings, main electrodes, and the like, focusing on the transistor using the oxide semiconductor which is formed over the circuit of FIG. 7A are illustrated in FIG. 7B. An oxide semiconductor region 110 having an island shape, a writing word line 112a, and a reading word line 112b are formed. Part of the writing word line 112a overlaps with the oxide semiconductor region 110 and serves as a gate electrode of the writing transistor. Further, a capacitor is formed in a portion where the reading word line 112b overlaps with the gate electrode 109.

FIG. 7C illustrates a structure where the structure illustrated in FIG. 7A overlaps with the structure illustrated in FIG. 7B, with which a wiring 116 formed thereover further overlaps. In FIG. 7C, the structures and the wiring are shifted a little from one another so as to see the overlap. Note that points A and B denote the same positions in FIGS. 7A to 7C. Although a design rule of such elements can be appropriately selected, it is preferable that a channel width of each transistor is greater than or equal to 10 nm and less than or equal to 0.4 μm and a channel length thereof is greater than or equal to 10 nm and less than or equal to 0.4 μm for an increase in the integration degree.

Figure 8A:
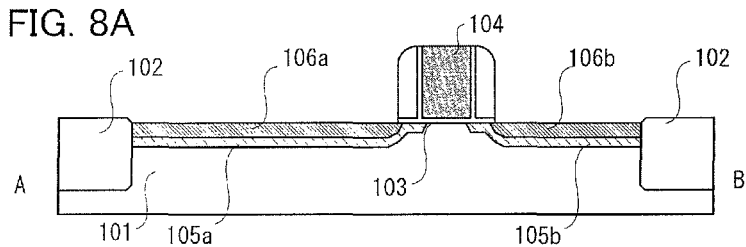
FIGS. 8A to 8D are diagrams illustrating manufacturing steps of a semiconductor memory device according to an embodiment of the present invention.

Hereinafter, a manufacturing method of a semiconductor memory device having the above-described structure is described. FIGS. 8A to 8D and FIGS. 9A to 9C are cross-sectional views taken along a line linking dot A to dot B in FIGS. 7A to 7C. First, with the use of a known semiconductor manufacturing technique, the element separation region 102, doped silicon regions (impurity regions) 105a and 105b, a gate insulating film 103, and a dummy gate 104 are formed over the single crystal silicon substrate 101 as illustrated in FIG. 8A. A sidewall may be provided on a side surface of the dummy gate 104 as illustrated in FIG. 8A.

The thickness of the gate insulating film is preferably 10 nm or more so that generation of leakage current is suppressed. In order that gate capacitance be less than the capacitance of a capacitor to be formed later, a material having a relatively low dielectric constant such as silicon oxide is preferably used as a material of the gate insulating film.

A silicide region may be provided over the impurity regions 105a and 105b so that conductivity is increased. In this specification, silicide regions and impurity regions which are formed in the above described manner are referred to as the source 106a and the drain 106b. As described referring to FIG. 7A, the regions partly serve as the reading bit line (i.e., the wiring 106c) and the bias line (i.e., the wiring 106d).

Figure 8B:
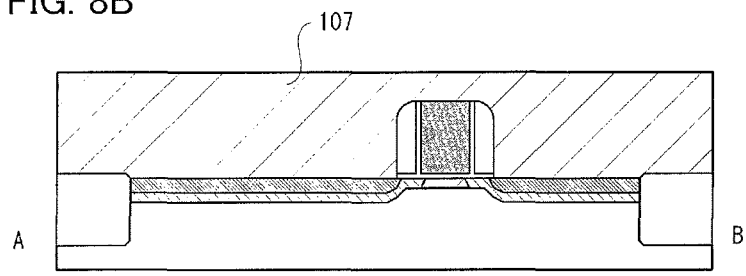
Figure 8C:
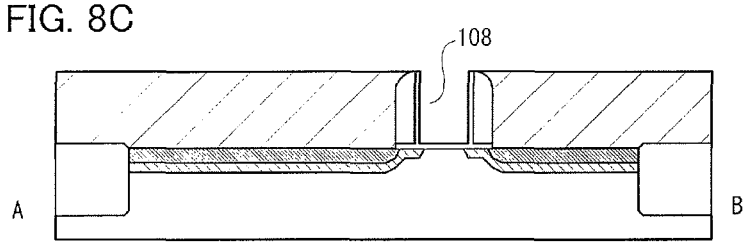

Next, an interlayer insulator 107 is formed as illustrated in FIG. 8B. The interlayer insulator 107 may be formed as a single layer or a multilayer and may include a stress liner for causing a distortion in the channel of the transistor. Then, the interlayer insulator 107 is etched and planarized by a chemical mechanical polishing (CMP) method; the etching is stopped upon exposure of the dummy gate 104. After that, as illustrated in FIG. 8C, a hole portion 108 is formed by selectively removing the dummy gate.

Figure 8D:
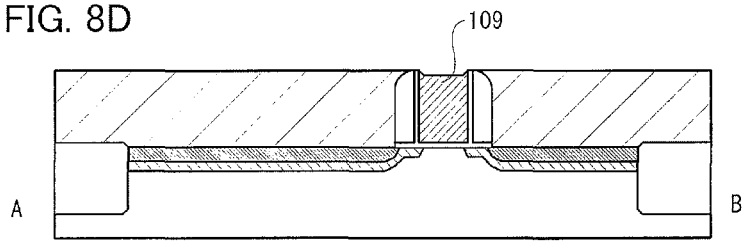

Then, a single-layer film or a stacked-layer film which contains a conductive material is deposited and planarized, whereby the gate electrode 109 is formed in the hole portion 108 as illustrated in FIG. 8D. Then, surface treatment using rare gas ions such as argon ions may be performed in order to reduce hydrogen concentration at a surface of the interlayer insulator 107. A material which forms an ohmic contact with an oxide semiconductor film to be formed later is preferable as a material of the gate electrode 109.

An example of such a material is a material whose work function W is almost the same as or smaller than electron affinity φ (an energy gap between the lowest end of the conduction band of the oxide semiconductor and the vacuum level) of the oxide semiconductor. In other words, W<φ+0.3 [electron volt] may be satisfied. For example, titanium, molybdenum, and titanium nitride can be given.

Then, the oxide semiconductor film having a thickness of 3 nm to 10 nm is formed by a sputtering method. A method other than a sputtering method may be employed as a method for forming the oxide semiconductor film. The oxide semiconductor contains at least one element selected from In, Ga, Sn, and Zn.

For example, a four-component oxide (an oxide containing four kinds of elements) such as an In—Sn—Ga—Zn-based oxide, a three-component oxide such as an In—Ga—Zn-based oxide, an In—Sn—Zn-based oxide, an In—Al—Zn-based oxide, a Sn—Ga—Zn-based oxide, an Al—Ga—Zn-based oxide, or a Sn—Al—Zn-based oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a single-component metal oxide such as an indium oxide, a tin oxide, a zinc oxide, or the like can be used. Further, Si, for example, may be contained in the above oxide semiconductor.

Here, for example, an In—Ga—Zn-based oxide means an oxide containing indium (In), gallium (Ga), and zinc (Zn), and there is no limitation on the composition ratio thereof.

As the oxide semiconductor, a material represented by the chemical formula, $InMO_3(ZnO)_m$ (m>0) can be used. Here, M represents one or more metal elements selected from Zn, Ga, Al, Mn, and Co. For example, M can be Ga, Ga and Al, Ga and Mn, Ga and Co, or the like.

When an In—Zn-based oxide is used as the oxide semiconductor, a target to be used has a composition ratio of In/Zn=0.5 to 50, preferably In/Zn=1 to 20, further preferably In/Zn=1.5 to 15 in an atomic ratio. For example, a target used for the formation of an In—Zn-based oxide has an atomic ratio of In:Zn:O=1:1:X, where X>1, preferably X>1.5.

Figure 9A:
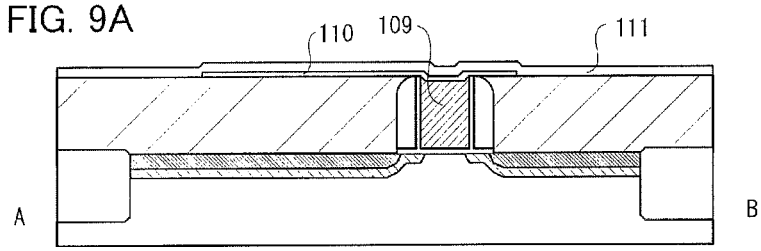
FIGS. 9A to 9C are diagrams illustrating manufacturing steps of a semiconductor memory device according to an embodiment of the present invention.

As illustrated in FIG. 9A, by etching the oxide semiconductor film which is formed in the above-described manner, the oxide semiconductor region 110 having an island shape is formed. The oxide semiconductor region 110 may be subjected to heat treatment so that semiconductor characteristics are improved. Thus, a structure can be obtained in which the gate electrode 109 and the oxide semiconductor region 110 are in contact with each other.

Then, a gate insulating film 111 is formed by a known deposition method such as a sputtering method as illustrated in FIG. 9A. In order that generation of leakage current be reduced, the thickness of the gate insulating film 111 is preferably 20 nm or more and the hydrogen concentration in the gate insulating film is preferably $1 \times 10^{-19}$ cm$^{-5}$ or less. Silicon oxide, aluminum oxide, hafnium oxide, lanthanum oxide, aluminum nitride, or the like may be used for the gate insulating film.

The gate insulating film 111 is a dielectric of a capacitor which is preferably formed using a material with a relative permittivity of 10 or more so that the capacitance of the capacitor is larger than the gate capacitance of the reading transistor. Heat treatment may be performed after the gate insulating film is formed so as to improve semiconductor characteristics.

Figure 9B:
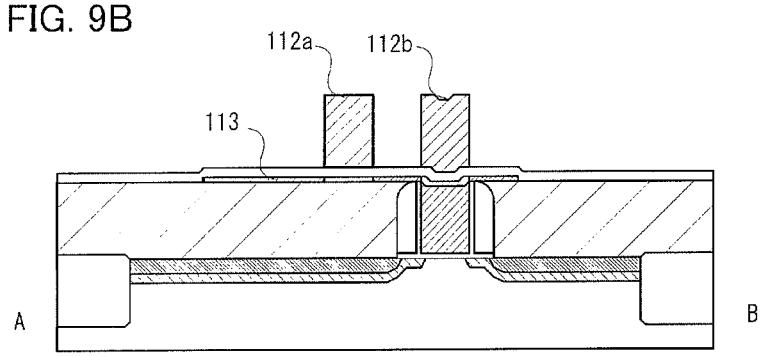

After that, the writing word line 112a and the reading word line 112b are formed using a conductive material. As illustrated in FIG. 9B, part of the writing word line 112a serves as the gate electrode of the transistor using the oxide semiconductor. Further, a capacitor is formed using part of the reading word line 112b and the gate electrode 109. As a material of the writing word line 112a, a material whose work function is larger than the electron affinity of the oxide semiconductor by 0.5 electron volts or more is preferable. Tungsten, gold, platinum, p-type silicon and the like can be given as examples.

Then, as illustrated in FIG. 9B, ions of an element which is more easily oxidized than the oxide semiconductor are implanted to the oxide semiconductor region by a known method for implanting ions. Examples of such an element are titanium, zinc, magnesium, silicon, phosphorus, boron, and the like. In general, boron and phosphorus are used in a conventional semiconductor process and thus easy to be used; particularly, as an ion to be implanted to the above-described thin gate insulating film 111 or the oxide semiconductor region 110, an ion of phosphorus whose atomic weight is greater than the atomic weight of boron is preferable.

It is desirable that the ions contain hydrogen as little as possible. The hydrogen concentration in the ions is preferably 0.1% or less. It is known that hydrogen is a donor in an oxide semiconductor; when hydrogen is contained in an ion, hydrogen implanted to an oxide semiconductor moves in the oxide semiconductor and causes a reduction in reliability of an element.

In the oxide semiconductor, oxygen deficiency is caused by the above-described implantation of ions and n-type conductivity is exhibited. An oxide semiconductor is different from a silicon semiconductor in that many oxide semiconductors can obtain high conductivity without such heat treatment which is needed in the case of a silicon semiconductor for recovery of crystallinity after implantation of ions. Needless to say, heat treatment may be performed on the oxide semiconductor after the implantation of ions. In this manner, a region 113 exhibiting n-type conductivity is formed in the oxide semiconductor region 110. It is preferable that conditions of implantation of ions be set so that carrier (electron) concentration in this region is $1 \times 10^{-15}$ cm$^{-3}$ or more.

Figure 9C:
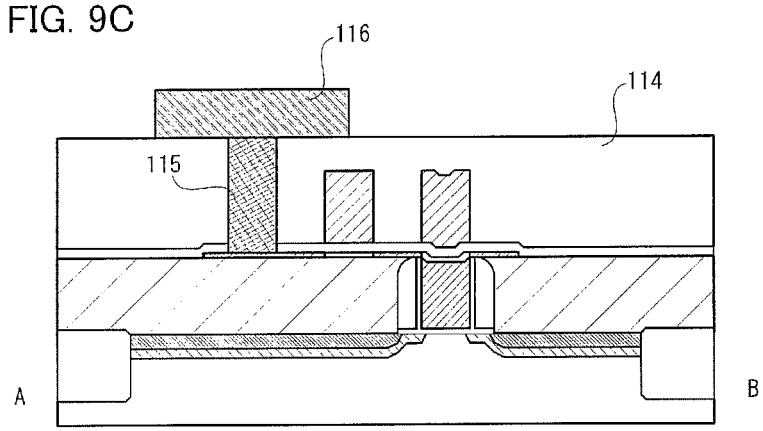

A basic element structure is completed through the above steps. After that, an interlayer insulator 114 of a single-layer thin film or a multilayer thin film is formed. A surface of the interlayer insulator 114 is planarized and a contact hole reaching the oxide semiconductor region 110 is formed, and a connection electrode 115 is embedded therein. Then, the wiring 116 is formed. The wiring 116 is a writing bit line. A similar wiring may be provided parallel to the writing word line 112a and the reading word line 112b. In this manner, the memory cell of the semiconductor memory device illustrated in FIG. 9C is manufactured.

Embodiment 4

Figure 10A:
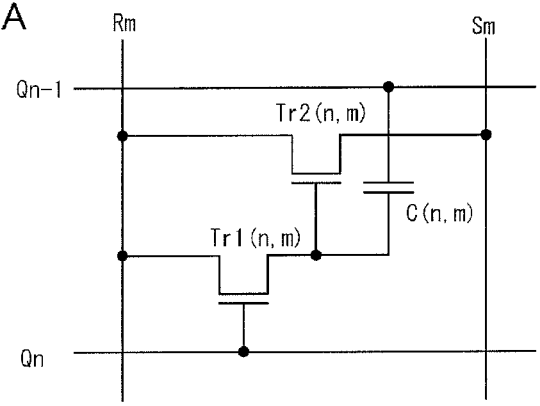
FIGS. 10A and 10B are circuit diagrams of a semiconductor memory device according to an embodiment of the present invention.
Figure 10B:
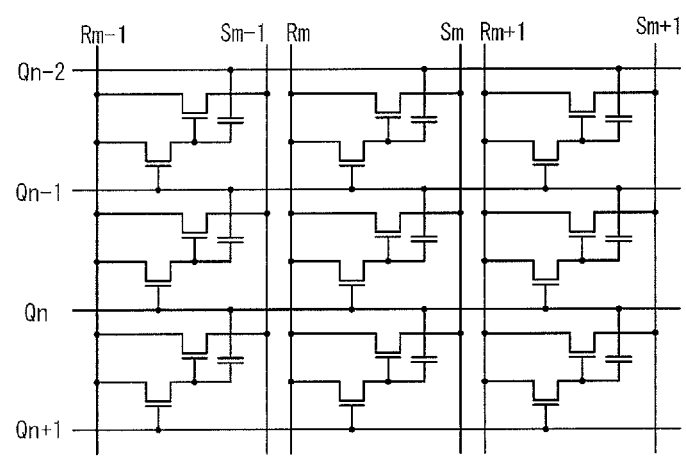

In this embodiment, a semiconductor memory device is described in which the number of wirings is smaller than that in the semiconductor memory device described in Embodiment 2. FIGS. 10A and 10B are circuit diagrams of a semiconductor memory device of this embodiment. In this embodiment, the writing bit line is substituted for the reading bit line in Embodiment 2. Therefore, the number of wirings is smaller than that in Embodiment 2. For example, in a semiconductor memory device having a matrix of N rows and M columns, the number of wirings is (N+2M+1).

Operation of a semiconductor memory circuit illustrated in FIGS. 10A and 10B is described. Here, both the writing transistor Tr1 and the reading transistor Tr2 are n-channel transistors.

A writing method is basically the same as the writing method in Embodiment 2. A pulse is sequentially applied to the writing word lines ( . . . , Qn−1, Qn, Qn+1, . . . ) as illustrated in FIG. 2A so that the writing transistor is turned on/off. At the same time, a signal is applied to the writing bit lines ( . . . , Rm−1, Rm, Rm+1, . . . ) so that data is written in a memory cell. The amount of charge held in each memory cell is similar to that described in Embodiment 1, which is shown in Table 1.

It is to be noted that a problem is caused by this structure where the writing bit line is substituted for the reading bit line. For example, positive charge is held in the memory cell in the n-th row and the m-th column and as a result, the reading transistor Tr2(n,m) of the memory cell is turned on at the time of writing in some cases. The potential of the writing bit line Rm is always changed because data is written in another memory cell in the same column. In the case where the bias line Sm is held at constant potential, current flows between the source and the drain of the reading transistor Tr2(n,m).

In order to prevent such current, a signal which is the same as a signal applied to the writing bit line Rm may be applied to the bias line in the same phase as the signal applied to the writing bit line Rm, so that the potential of the bias line Sm is the same as the potential of the writing bit line Rm. Alternatively, a signal applied to the bias line Sm may be synchronized with a signal applied to the writing bit line Rm.

Current does not flow between the source and the drain of the reading transistor Tr2(n,m) in theory because the potential of the writing bit line Rm and that of the bias line Sm are set to be equal to each other. Even when the potential of the writing bit line Rm and that of the bias line Sm are not the same, current flowing between the source and the drain of the reading transistor Tr2(n,m) can be sufficiently reduced by adjusting the potential of the bias line Sm to that of the writing bit line Rm so that an effective potential difference is sufficiently small. In order that an effect of this embodiment is obtained, the phase of the potential of the bias line Sm is preferably deviated from the phase of the potential of the writing bit line Rm by 5% or less.

Next, a reading method is described. In an example below, data is sequentially read per row; it is also possible that only data in a specific memory cell is read in a similar manner. The reading method is similar to that in Embodiment 2. At the time of reading, the bias lines ( . . . , Sm−1, Sm, Sm+1, . . . ) are held at constant potential $V_{SH}$. The potential $V_{SH}$ can be set to, for example, 0 volts.

Pulses are applied to the writing word lines as illustrated in FIG. 6A. For example, each height can be set as follows: $V_{PL}$=−6 [volt], $V_{P1}$=−5 [volt], $V_{P2}$=−4 [volt], and $V_{P3}$=−3 [volt].

Similarly to Embodiment 2, a state (an on state or an off state) of the reading transistor Tr2 is changed depending on the amount of charge held on the drain side of the writing transistor Tr1. By monitoring the potential of the writing bit line, a state (an on state or an off state) of the reading transistor in response to a pulse applied to the writing word line in the preceding row can be known. Further, similarly to Embodiment 2, the amount of charge held in each memory cell, i.e., data, can be known by counting the number of pulses.

Embodiment 5

Figure 11A:
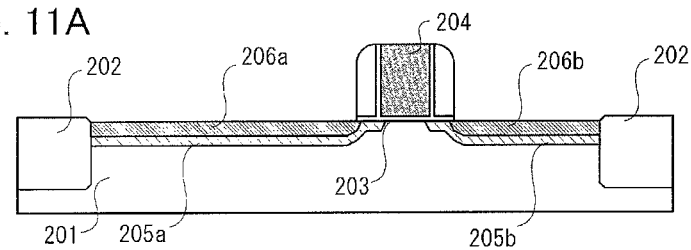
FIGS. 11A to 11D are diagrams illustrating manufacturing steps of a semiconductor memory device according to an embodiment of the present invention.

In this embodiment, a manufacturing method of a semiconductor memory device having the structure described in Embodiment 4, in which a writing bit line also serves as a reading bit line, is described with reference to FIGS. 11A to 11D and FIGS. 12A and 12B. First, with the use of a known semiconductor manufacturing technique, over a single crystal silicon substrate 201, an element separation region 202, doped silicon regions (impurity regions) 205a and 205b, a gate insulating film 203, and a dummy gate 204 are formed as illustrated in FIG. 11A. A sidewall may be provided on a side surface of the dummy gate 204 as illustrated in FIG. 11A.

A silicide region 206a and a silicide region 206b are provided over the impurity region 205a and the impurity region 205b, respectively, so that conductivity is increased. The impurity regions 205a and 205b and the silicide regions 206a and 206b partly serve as the writing bit line and the bias line.

Figure 11B:
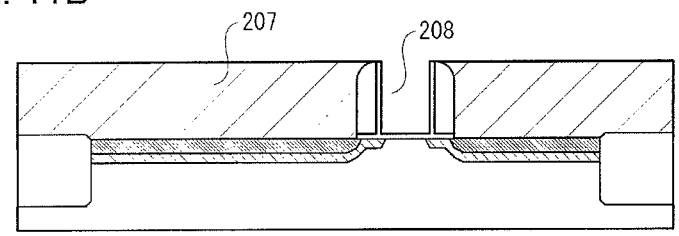
Figure 11C:
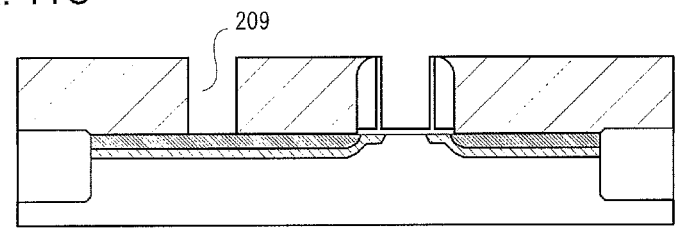

Then, an interlayer insulator 207 is formed. Then, as in the method described in Embodiment 3 the interlayer insulator 207 is etched and planarized; the etching is stopped upon exposure of the dummy gate 204. After that, as illustrated in FIG. 11B, a hole portion 208 is formed by selectively removing the dummy gate 204. Further, as illustrated in FIG. 1 IC, a contact hole 209 reaching the silicide region 206a is formed in the interlayer insulator 207.

Figure 11D:
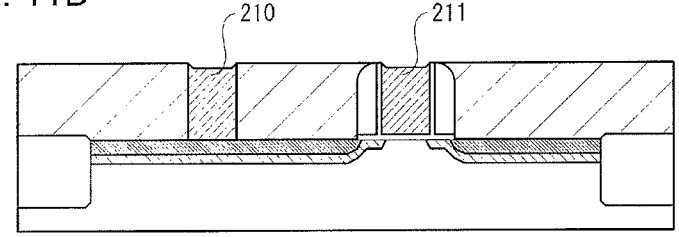

Then, a single-layer film or a stacked-layer film which contains a conductive material is deposited and planarized, whereby a gate electrode 211 and a connection electrode 210 are formed in the hole portion 208 and the contact hole 209, respectively, as illustrated in FIG. 11D.

Figure 12A:
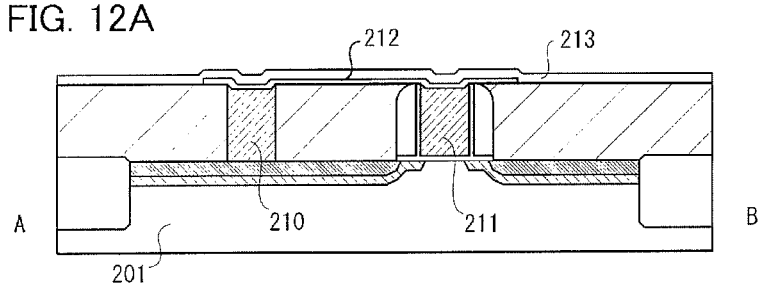
FIGS. 12A and 12B are diagrams illustrating manufacturing steps of a semiconductor memory device according to an embodiment of the present invention.

Next, an oxide semiconductor region 212 having an island shape is formed to a thickness of 3 nm to 10 nm and a gate insulating film 213 is then formed as illustrated in FIG. 12A.

Figure 12B:
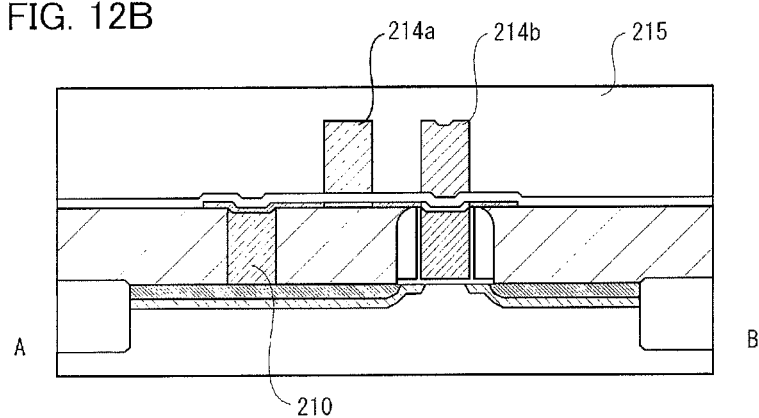

After that, a writing word line 214a and a writing word line 214b are formed using a conductive material. As illustrated in FIG. 12B, part of the writing word line 214a serves as a gate electrode of a transistor using an oxide semiconductor. A capacitor is formed using part of the writing word line 214b and the gate electrode 211.

Then, ions of an element which is more easily oxidized than the oxide semiconductor are implanted to the oxide semiconductor region by a known method for implanting ions. After that, an interlayer insulator 215 of a single-layer thin film or a multilayer thin film is formed. In this manner, a memory cell of a semiconductor memory device which is illustrated in FIG. 12B is manufactured.

Embodiment 6

Figure 13A:
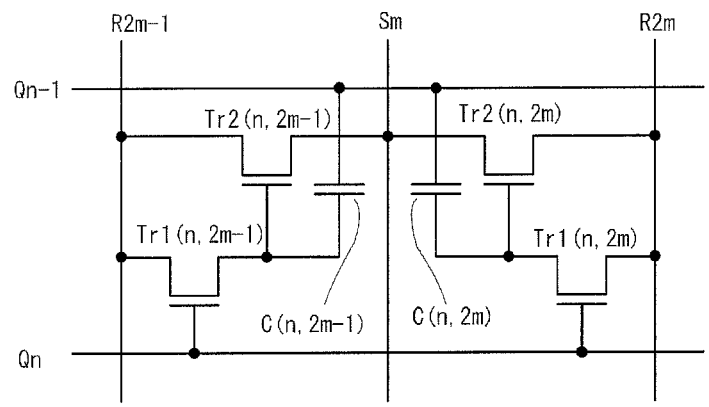
FIGS. 13A and 13B are circuit diagrams illustrating a semiconductor memory device according to an embodiment of the present invention.
Figure 13B:
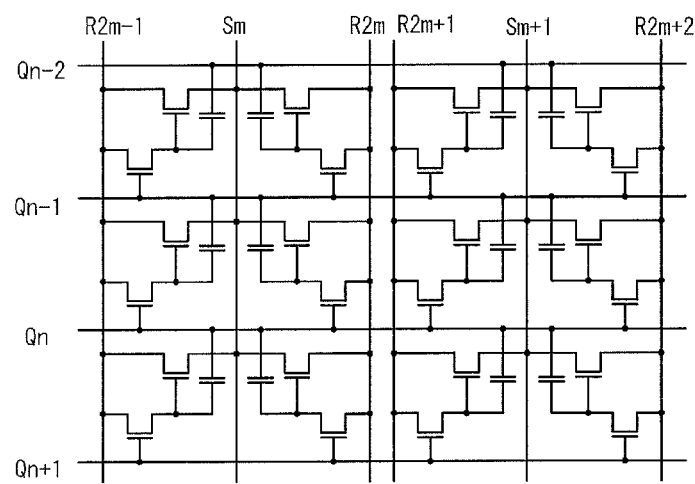
Figure 14:
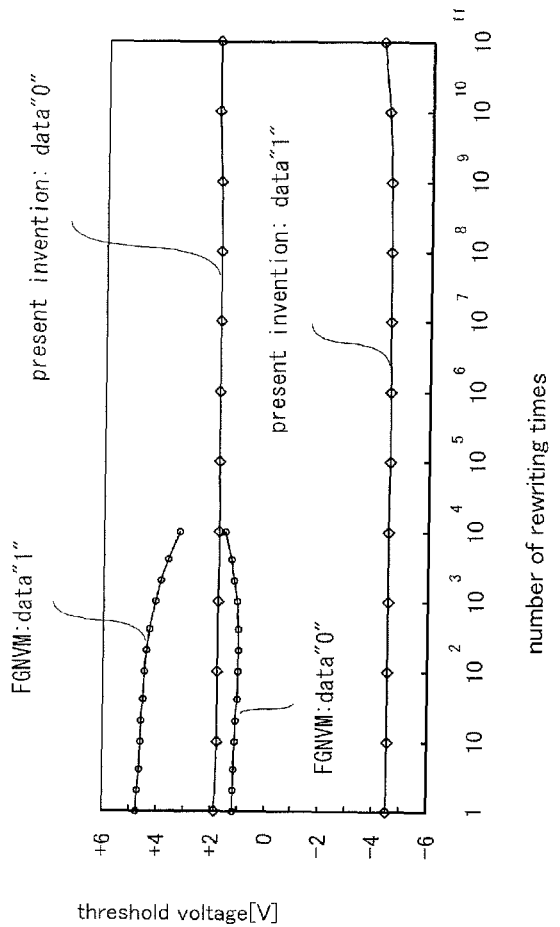
FIG. 14 is a graph showing deterioration (change in a threshold value) due to rewriting in a memory cell of an embodiment of the present invention and that in a memory cell of a conventional FGNVM.
Figure 15:
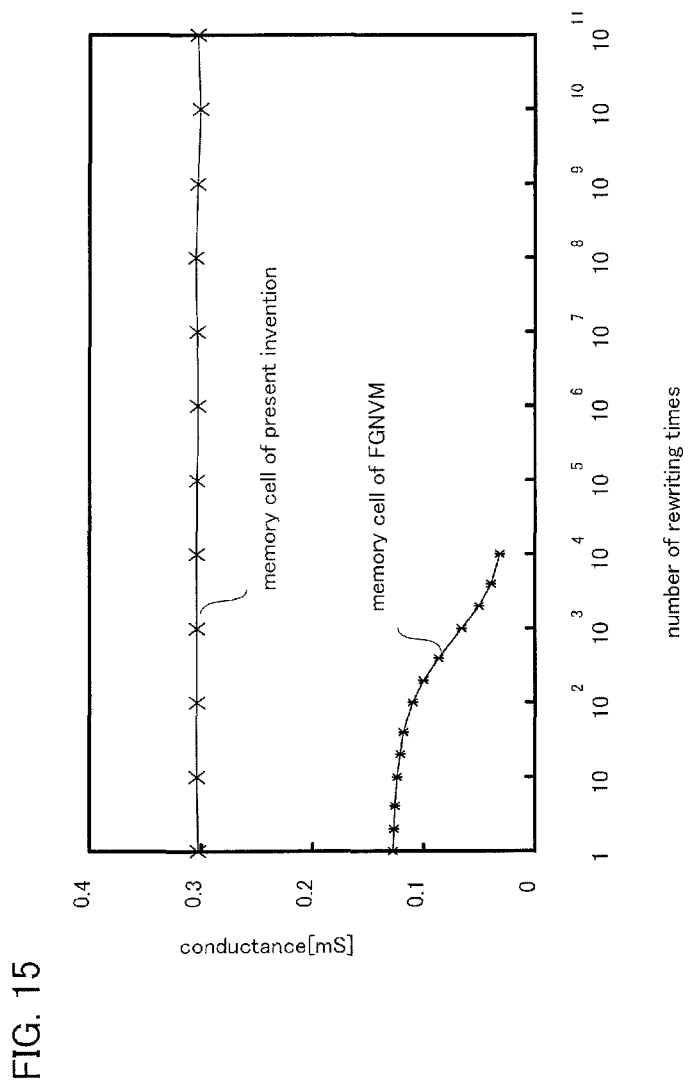
FIG. 15 is a graph showing deterioration of conductance due to rewriting in a memory cell of an embodiment of the present invention and a memory cell of a conventional FGNVM.

In this embodiment, a semiconductor memory device is described in which the number of wirings is smaller than that in the semiconductor memory device described in Embodiment 4. FIGS. 13A and 13B are circuit diagrams of a semiconductor memory device of this embodiment. In this embodiment, a bias line, which is provided in each column in Embodiment 4, is shared by adjacent memory cells. As illustrated in FIG. 13A, the bias line Sm of a memory cell in the n-th row and the (2m−1)-th column also serves as a bias line of a memory cell in the n-th row and the 2m-th column.

Therefore, the number of wirings is smaller than that in Embodiment 4. For example, in a semiconductor memory device having a matrix of N rows and 2M columns, the number of wirings is (N+3M+1). The number of wirings in a semiconductor memory device having a matrix of N rows and 2M columns is (2N+6M) according to Embodiment 1, (1N+6M+1) according to Embodiment 2, or (1N+4M+1) according to Embodiment 4.

The memory cell in the n-th row and the 2m-th column and a portion around the memory cell are illustrated in FIG. 13B. A driving method of the semiconductor memory device in this embodiment is basically the same as that in Embodiment 4.

Embodiment 7

Figure 16A:
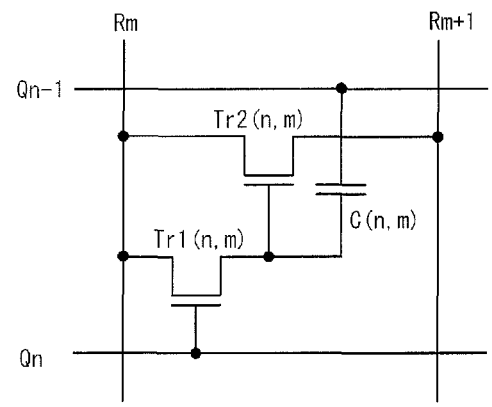
FIGS. 16A and 16B are circuit diagrams of a semiconductor memory device according to an embodiment of the present invention.
Figure 16B:
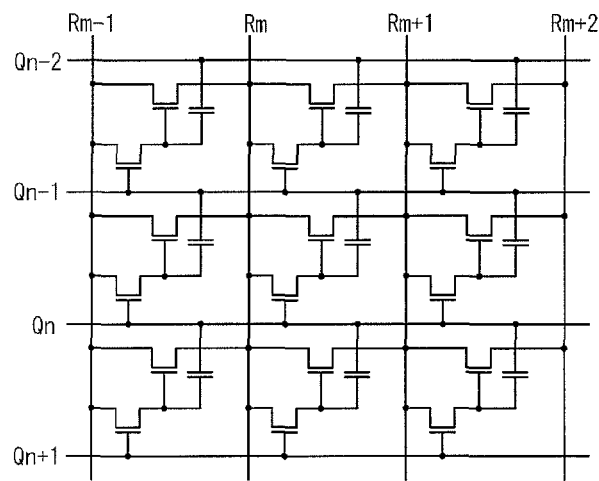

In this embodiment, a semiconductor memory device is described in which the number of wirings is smaller than that in the semiconductor memory device described in Embodiment 4. FIGS. 16A and 16B are circuit diagrams of a semiconductor memory device of this embodiment. In this embodiment, a writing bit line in an adjacent column is substituted for a bias line which is provided in each column in Embodiment 4. As illustrated in FIG. 16A, the writing bit line Rm+1 in the (m+1)-th column is substituted for the bias line of the memory cell in the m-th column.

Therefore, the number of wirings is smaller than that in Embodiment 4. For example, in a semiconductor memory device having a matrix of N rows and M columns, the number of wirings is (N+M+2).

The memory cell in the n-th row and the m-th column and a portion around the memory cell are illustrated in FIG. 16B. A writing method of the semiconductor memory device in this embodiment is basically the same as that in Embodiment 4.

Next, a reading method is described with reference to FIGS. 17A and 17B and FIGS. 18A to 18E. Similarly to Embodiment 2 or 4, a pulse is applied to the writing word lines ( . . . , Qn−1, Qn, Qn+1, . . . ) at the time of reading.

Further, the writing bit lines ( . . . , Rm−1, Rm, Rm+1, . . . ) are held at potential $V_{SH}$ or potential $V_{SL}$ ($V_{SH}$>$V_{SL}$) or is connected to a potential determination circuit, depending on a column in which reading is performed. The potential determination circuit may include a means for supplying potential. The potential determination circuit is provided for each column and is electrically connected to the writing bit line Rm in the m-th column when reading is performed in a memory cell in the (m−1)-th column.

The potential determination circuit includes at least a terminal of a wiring connectable to the writing bit line, a potential measure means, a capacitor, and a switching mechanism which switches connection of the capacitor between the potential measure means and the terminal. The writing bit line Rm is connected to the capacitor or the potential measure means by the switching mechanism at the time of reading data in the (m−1)-th column.

Figure 17A:
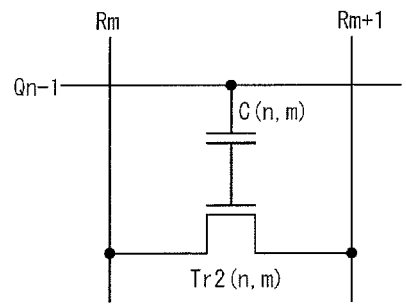
FIGS. 17A and 17B are diagrams illustrating a driving method (reading) of a semiconductor memory device according to an embodiment of the present invention.
Figure 17B:
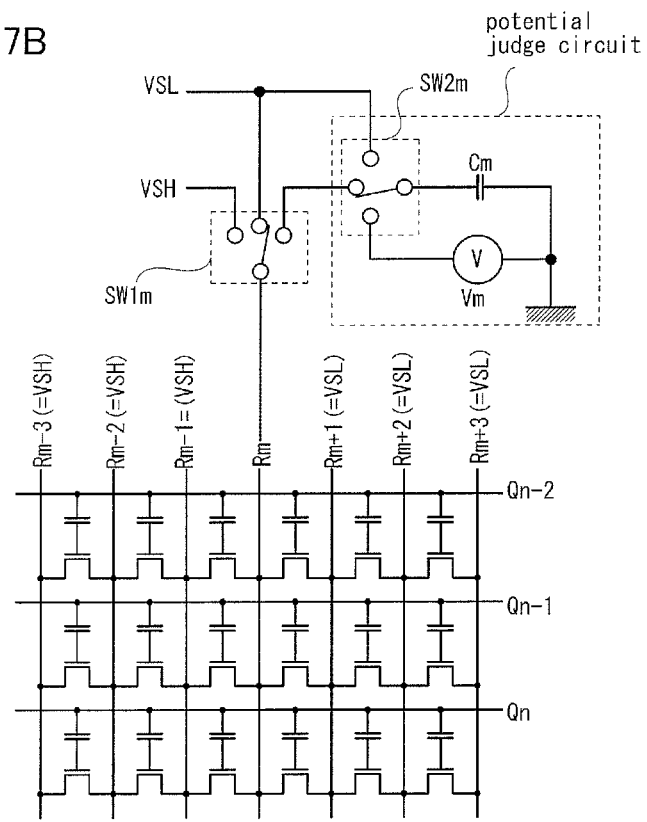

In FIG. 17B, the potential determination circuit and a means for supplying the writing bit line Rm with the potential $V_{SL}$ or $V_{SH}$ are illustrated. The writing bit line Rm can be connected to one of the potential determination circuit and the means by a switch SW1m. The potential determination circuit in the m-th column includes, as illustrated in FIG. 17B, a switch SW2m, a potential measure means Vm, a capacitor Cm, and a terminal connected to the means for supplying the potential $V_{SL}$. The switch SW2m connects the capacitor to any of a wiring on the writing bit line Rm side, the terminal, and the potential measure means Vm. The potential of the capacitor is preferably set to $V_{SL}$ by connecting the capacitor to the terminal except when reading of data is performed.

A method for reading data in the n-th row and the (m−1)-th column is described below. The circuit illustrated in FIG. 16A at the time of reading is expressed by an equivalent circuit illustrated in FIG. 17A. Thus, the memory cell in the n-th row and the (m−1)-th column and memory cells around the memory cell are expressed as a matrix illustrated in FIG. 17B at the time of reading. When data in a memory cell in the (m−1)-th column is read, the potential of the writing bit lines in the (m−1)-th column and columns on the left side of the (m−1)-th column is set to $V_{SH}$ and the potential of the writing bit lines in the (m+1)-th column and columns on the right side of the (m+1)-th column is set to $V_{SL}$.

The potential of the writing bit line Rm is set to $V_{SL}$ by the switch SW1m before the writing bit line Rm is connected to the potential determination circuit. Then, the writing bit line Rm and the potential determination circuit are connected to each other by the switch SW1m. At this time, in the potential determination circuit, the writing bit line Rm and the capacitor Cm are connected to each other. Power is stored in the capacitor Cm so that the potential of the capacitor Cm on the writing bit line Rm side is $V_{SL}$.

In each of memory cells on the left side of the writing bit line Rm−1 and memory cells on the right side of the writing bit line Rm+1, the source and the drain of the reading transistor are at the same potential and current does not flow; therefore, the memory cells can be considered not to exist in the circuit. The memory cells other than the memory cells connected to the writing word line Qn−1 can also be considered not to exist in the circuit because the reading transistors therein are set so as to be in an off state.

Figure 18A:
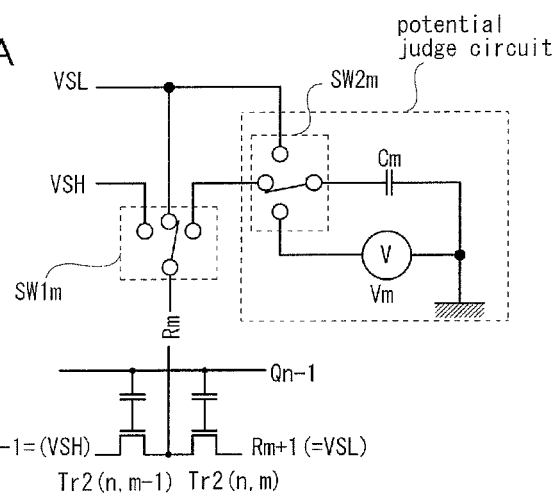
FIGS. 18A to 18E are diagrams illustrating a driving method (reading) of a semiconductor memory device according to an embodiment of the present invention.

As a result, as illustrated in FIG. 18A, circuits which can be considered to function as part of the circuit are the memory cell in the n-th row and the (m−1)-th column and the memory cell in the n-th row and the m-th column with the writing bit line Rm provided therebetween, particularly a circuit including the reading transistor Tr2(n,m−1) and the reading transistor Tr2(n,m) in its center portion. These transistors are turned on/off in accordance with the potential of the writing word line Qn−1 in the (n−1)-th row.

It is considered that a transistor in an off state becomes extremely high resistance and breaks a circuit. This state can be expressed as a capacitor having an extremely small capacitance. On the other hand, the transistor has limited resistance even in an on state. Therefore, depending on combination of an on state and an off state of the reading transistor Tr2(n,m−1) and the reading transistor Tr2(n,m) (that is, combination of data in the memory cell in the n-th row and the (n−1)-th column and data in the memory cell in the n-th row and the m-th column), equivalent circuits illustrated in FIGS. 18B to 18E are obtained.

Figure 18B:
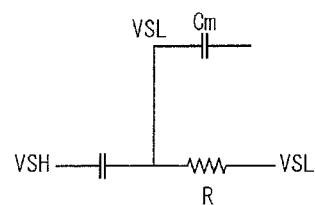
Figure 18C:
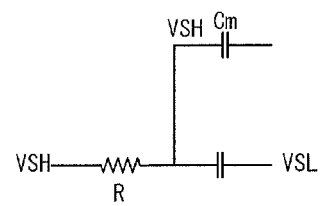
Figure 18D:
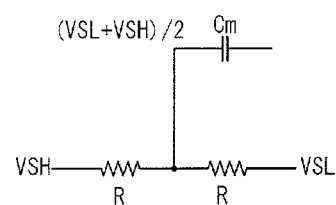

For example, when the reading transistor Tr2(n,m−1) is in an off state and the reading transistor Tr2(n,m) is in an on state, the circuit illustrated in FIG. 18B is realized. Similarly, when the reading transistor Tr2(n,m−1) is in an on state and the reading transistor Tr2(n,m) is in an off state, the circuit illustrated in FIG. 18C is realized. When both the reading transistor Tr2(n,m−1) and the reading transistor Tr2(n,m) are in an on state, the circuit illustrated in FIG. 18D is realized. When the reading transistor Tr2(n,m−1) and the reading transistor Tr2(n,m) are in an off state, the circuit illustrated in FIG. 18E is realized.

The more uniform the size or shape of the transistors, the closer the resistances of the transistors to each other. Transistors of exactly the same size have the same resistance. Since the reading transistors used in the memory cells are designed to have the same volume, size, material, or shape, it can be considered that the reading transistors have almost the same resistance.

Figure 18E:
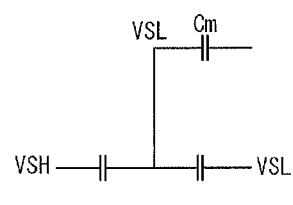

The potential of the capacitor Cm on the writing bit line Rm side when the circuit becomes stable and current stops flowing (i.e., when a constant state is realized; in other words, when charge corresponding to the state is stored in the capacitor Cm) is ideally $V_{SL}$ in FIG. 18B, $V_{SH}$ in FIG. 18C, $(V_{SL}+V_{SH})/2$ in FIG. 18D, and $V_{SL}$ in FIG. 18E. In FIG. 18E, since a state of the bias line is not changed from the initial state, the potential of the capacitor Cm on the writing bit line Rm side is $V_{SL}$.

Here, regardless of the state of the reading transistor Tr2(n,m), the potential of the capacitor Cm on the writing bit line Rm side is $V_{SL}$ when the reading transistor Tr2(n,m−1) is in an off state (the state illustrated in FIG. 18B and that illustrated in FIG. 18E). Alternatively, regardless of the state of the reading transistor Tr2(n,m), the potential of the capacitor Cm on the writing bit line Rm side has a value other than $V_{SL}$ when the reading transistor Tr2(n,m−1) is in an on state (the state illustrated in FIG. 18C and that illustrated in FIG. 18D). Thus, by observing the potential of the capacitor Cm on the writing bit line Rm side, the state of the reading transistor Tr2(n,m−1) can be known.

The value of $V_{SH}$ and that of $V_{SL}$ can be, for example, +3 volts and 0 volts, respectively. The potential of the capacitor Cm on the writing bit line R/77 side can be measured by connecting the capacitor Cm and the potential measure means Vm by the switch SW2m. In the case where the ground potential is 0 volts and it is observed that some charge is stored in the capacitor Cm by the potential measure means Vm, it can be known that the reading transistor Tr2(n,m−1) is in an on state. Alternatively, in the case where it is observed that no charge is stored in the capacitor, it can be known that the reading transistor Tr2(n,m−1) is in an off state. In this manner, reading can be performed in each memory cell.

In the above-described example, the potential of the writing bit lines in the (m−1)-th column and the columns on the left side of the (m−1)-th column is set to $V_{SH}$ and the potential of the writing bit lines in the (m+1)-th column and the columns on the right side of the (m+1)-th column is set to $V_{SL}$; alternatively, the potential of the writing bit lines in the (m−1)-th column and the columns on the left side of the (m−1)-th column may be set to $V_{SL}$ and the potential of the writing bit lines in the (m+1)-th column and the columns on the right side of the (m+1)-th column may be set to $V_{SH}$. In addition, the potential of the capacitor Cm may be $V_{SH}$ at the time of reading, although the potential of the capacitor Cm is $V_{SL}$ in the above-described example. When each potential is changed as described above, it is to be noted that a cell in which reading can be performed is different.

This application is based on Japanese Patent Application serial no. 2010-047902 filed with Japan Patent Office on Mar. 4, 2010, the entire contents of which are hereby incorporated by reference.

EXPLANATION OF REFERENCE

101: single crystal silicon substrate, 102: element separation region, 103: gate insulating film, 104: dummy gate, 105a: impurity region, 105b: impurity region, 106a: source, 106b: drain, 106c: wiring, 106d: wiring, 107: interlayer insulator, 108: hole portion, 109: gate electrode, 110: oxide semiconductor region, 111: gate insulating film, 112a: writing word line, 112b: reading word line, 113: region exhibiting n-type conductivity, 114: interlayer insulator, 115: connection electrode, 116: wiring, 201: single crystal silicon substrate, 202: element separation region, 203: gate insulating film, 204: dummy gate, 205a: impurity region, 205b: impurity region, 206a: silicide region, 206b: silicide region, 207: interlayer insulator, 208: hole portion, 209: contact hole, 210: connection electrode, 211: gate electrode, 212: oxide semiconductor region, 213: gate insulating film, 214a: writing word line, 214b: writing word line, and 215: interlayer insulator

The invention claimed is:
1. A semiconductor memory device comprising:
  a first memory cell including a first transistor, a second transistor, and a capacitor;
  a second memory cell including a third transistor;
  a first line;
  a second line;
  a third line;
  a fourth line; and
  a fifth line,
  wherein a gate of the first transistor is electrically connected to the first line, wherein one of a source and a drain of the first transistor is electrically connected to a gate of the second transistor and a first electrode of the capacitor, wherein a second electrode of the capacitor and a gate of the third transistor are electrically connected to the second line, wherein the other of the source and the drain of the first transistor is electrically connected to the third line, wherein one of a source and a drain of the second transistor is electrically connected to the fourth line, and wherein the other of the source and the drain of the second transistor is electrically connected to the fifth line.

2. The semiconductor memory device according to claim 1, wherein the first line and the second line are parallel to each other, and wherein the third line, the fourth line, and the fifth line are parallel to each other.

3. The semiconductor memory device according to claim 1, wherein the first line and the third line are orthogonal to each other.

4. The semiconductor memory device according to claim 1, wherein one of a source and a drain of the third transistor is electrically connected to the third line.

5. The semiconductor memory device according to claim 1, wherein at least one of the first transistor, the second transistor, and the third transistor includes an oxide semiconductor.

6. The semiconductor memory device according to claim 1, wherein, when the third line is supplied with a first potential, the fourth line is supplied with a second potential which is substantially the same potential as the first potential.

7. A semiconductor device including the semiconductor memory device according to claim 1.

8. A semiconductor memory device comprising:
a first memory cell including a first transistor, a second transistor, and a capacitor;
a second memory cell including a third transistor;
a first line;
a second line;
a third line; and
a fourth line,
wherein a gate of the first transistor is electrically connected to the first line,
wherein one of a source and a drain of the first transistor is electrically connected to a gate of the second transistor and a first electrode of the capacitor,
wherein a second electrode of the capacitor and a gate of the third transistor are electrically connected to the second line,
wherein the other of the source and the drain of the first transistor is electrically connected to the third line,
wherein one of a source and a drain of the second transistor is electrically connected to the fourth line, and
wherein the other of the source and the drain of the second transistor is electrically connected to the third line.

9. The semiconductor memory device according to claim 8, wherein the first line and the second line are parallel to each other, and
wherein the third line and the fourth line are parallel to each other.

10. The semiconductor memory device according to claim 8, wherein the first line and the third line are orthogonal to each other.

11. The semiconductor memory device according to claim 8, wherein one of a source and a drain of the third transistor is electrically connected to the third line.

12. The semiconductor memory device according to claim 8, wherein at least one of the first transistor, the second transistor, and the third transistor includes an oxide semiconductor.

13. The semiconductor memory device according to claim 8, wherein, when the third line is supplied with a first potential, the fourth line is supplied with a second potential which is substantially the same potential as the first potential.

14. A semiconductor device including the semiconductor memory device according to claim 8.

15. A semiconductor memory device comprising:
a first memory cell including a first transistor, a second transistor, and a first capacitor;
a second memory cell including a third transistor;
a third memory cell including a fourth transistor, a fifth transistor, and a second capacitor;
a first line;
a second line;
a third line; and
a fourth line,
wherein a gate of the first transistor and a gate of the fourth transistor are electrically connected to the first line,
wherein one of a source and a drain of the first transistor is electrically connected to a gate of the second transistor and a first electrode of the first capacitor,
wherein one of a source and a drain of the fourth transistor is electrically connected to a gate of the fifth transistor and a first electrode of the second capacitor,
wherein a second electrode of the first capacitor, a second electrode of the second capacitor, and a gate of the third transistor are electrically connected to the second line,
wherein the other of the source and the drain of the first transistor is electrically connected to the third line,
wherein one of a source and a drain of the second transistor and one of a source and a drain of the fifth transistor are electrically connected to the fourth line, and
wherein the other of the source and the drain of the second transistor is electrically connected to the third line.

16. The semiconductor memory device according to claim 15, wherein the first line and the second line are parallel to each other, and
wherein the third line and the fourth line are parallel to each other.

17. The semiconductor memory device according to claim 15, wherein the first line and the third line are orthogonal to each other.

18. The semiconductor memory device according to claim 15, wherein one of a source and a drain of the third transistor is electrically connected to the third line.

19. The semiconductor memory device according to claim 15, wherein at least one of the first transistor, the second transistor, and the third transistor includes an oxide semiconductor.

20. The semiconductor memory device according to claim 15, wherein, when the third line is supplied with a first potential, the fourth line is supplied with a second potential which is substantially the same potential as the first potential.

21. A semiconductor device including the semiconductor memory device according to claim 15.

* * * * *